(12) United States Patent
Kim

(10) Patent No.: US 9,136,446 B2
(45) Date of Patent: Sep. 15, 2015

(54) LIGHT EMITTING DEVICE AND LIGHTING SYSTEM WITH THE SAME

(75) Inventor: Shin Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 13/361,555

(22) Filed: Jan. 30, 2012

(65) Prior Publication Data

US 2013/0001615 A1 Jan. 3, 2013

(30) Foreign Application Priority Data

Jun. 30, 2011 (KR) .................. 10-2011-0064933

(51) Int. Cl.
*H01L 33/00* (2010.01)
*H01L 33/58* (2010.01)
*H01L 33/62* (2010.01)
*H01L 33/38* (2010.01)
*H01L 33/46* (2010.01)
*H01L 33/42* (2010.01)

(52) U.S. Cl.
CPC .............. *H01L 33/58* (2013.01); *H01L 33/38* (2013.01); *H01L 33/62* (2013.01); *H01L 33/42* (2013.01); *H01L 33/46* (2013.01); *H01L 2224/48091* (2013.01); *H01L 2924/01322* (2013.01); *H01L 2924/3025* (2013.01); *H01L 2933/0083* (2013.01)

(58) Field of Classification Search
USPC ............... 25/98–99; 257/E33.064, E33.065, 257/98–99
See application file for complete search history.

(56) References Cited

U.S. PATENT DOCUMENTS

| | | | |
|---|---|---|---|
| 6,287,947 B1 | 9/2001 | Ludowise et al. | |
| 2002/0000563 A1 | 1/2002 | Udagawa | |
| 2004/0026702 A1 | 2/2004 | Yamada et al. | |
| 2005/0199888 A1* | 9/2005 | Seong et al. | 257/79 |
| 2007/0018184 A1* | 1/2007 | Beeson et al. | 257/98 |
| 2007/0114636 A1* | 5/2007 | Erchak et al. | 257/611 |
| 2008/0121923 A1* | 5/2008 | Harle et al. | 257/100 |
| 2009/0152583 A1 | 6/2009 | Chen et al. | |
| 2010/0032701 A1* | 2/2010 | Fudeta | 257/98 |
| 2010/0072487 A1* | 3/2010 | Tsai et al. | 257/86 |
| 2010/0123166 A1* | 5/2010 | Bae | 257/103 |
| 2010/0264442 A1* | 10/2010 | Lee | 257/98 |
| 2011/0012154 A1 | 1/2011 | Okagawa et al. | |
| 2011/0169044 A1* | 7/2011 | Chen | 257/99 |
| 2011/0233602 A1* | 9/2011 | Hwang | 257/99 |
| 2011/0254021 A1 | 10/2011 | Zhu et al. | |
| 2012/0025248 A1* | 2/2012 | Bae | 257/98 |
| 2012/0032214 A1 | 2/2012 | Ito et al. | |
| 2012/0235189 A1* | 9/2012 | Hsu | 257/98 |

FOREIGN PATENT DOCUMENTS

DE 100 17 758 A1 12/2000
JP 2001-148511 A 5/2001

* cited by examiner

*Primary Examiner* — Cheung Lee
*Assistant Examiner* — Frederick B Hargrove
(74) *Attorney, Agent, or Firm* — Birch, Stewart, Kolasch & Birch, LLP

(57) ABSTRACT

Embodiments provide a light emitting device including a light emitting structure having a first conduction type semiconductor layer, an active layer, and a second conduction type semiconductor layer, a metal filter of an irregular pattern on the light emitting structure, and openings between the irregular patterns in the metal filter.

20 Claims, 27 Drawing Sheets

Fig. 6
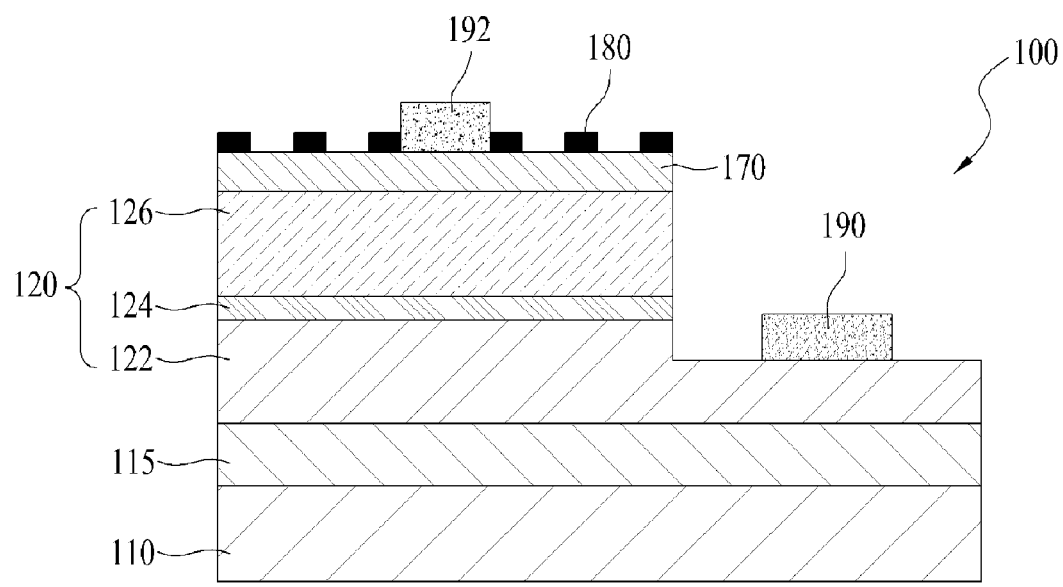
[Fig. 7]
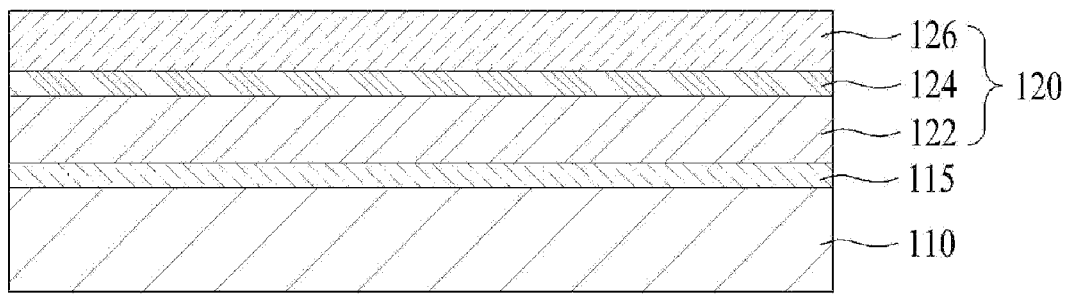

Laser

LIGHT EMITTING DEVICE AND LIGHTING SYSTEM WITH THE SAME

CROSS REFERENCE TO RELATED APPLICATION

This application claims priority under 35 U.S.C. §119 to Korean Patent Application No. 10-2011-0064933, filed in Korea on Jun. 30, 2011, which is hereby incorporated in its entirety by reference as if fully set forth herein.

TECHNICAL FIELD

Embodiments relate to a light emitting device and a lighting system with the same.

BACKGROUND

The light emitting device, such as a light emitting diode of III-V group or II-VI group compound semiconductor or a laser diode, can produce various colors, such as red, blue, and ultra-violet owing to development of the thin film growth technology and device materials therefor, as well as a white color of good efficiency by using a fluorescent material or mixing colors.

Owing to development of such technologies, application of the light emitting device is expanding, not only to the display device, but also even to transmission modules of optical communication means, a light emitting diode back light unit which is replacing CCFL (Cold Cathode Fluorescence Lamp) of the back light unit in an LCD (Liquid Crystal Display) device, white light emitting diode lighting fixtures, car head lights, and signal lamps.

SUMMARY

Embodiments provide a light emitting device and a lighting system with the same.

In one embodiment, a light emitting device includes a light emitting structure having a first conduction type semiconductor layer, an active layer, and a second conduction type semiconductor layer, a metal filter of an irregular pattern disposed on the light emitting structure, and openings disposed between the irregular patterns in the metal filter.

The metal filter may include aluminum or Titanium.

The metal filter may reflect a light from the light emitting structure.

The light emitting structure may have a roughness disposed on a surface thereof.

The metal filter may have a stripe type pattern.

The metal filter may have a mesh type pattern.

The pattern may have irregular widths.

The openings may have irregular widths.

At least one of the patterns may have a first side width different from a second side width.

The pattern width may be 10 to 20% of the opening width.

The metal filter may have a thickness of 1 μm to 10 μm.

The light emitting device may further include a transparent conductive layer disposed on the first conduction type semiconductor layer and the metal filter.

The light emitting device may further include a transparent conductive layer disposed on the first conduction type semiconductor layer, and the metal filter may be disposed on the transparent conductive layer.

The light emitting device may further include a transparent conductive layer disposed on the first conduction type semiconductor layer, and the metal filter may be arranged in the transparent conductive layer.

The transparent conductive layer may include a first transparent conductive layer disposed on the first conduction type semiconductor layer, and a second transparent conductive layer disposed on the first transparent conductive layer, and the metal filter may be disposed between the first transparent conductive layer and the second transparent conductive layer.

The light emitting device may further include a passivation layer disposed at a side of the light emitting structure extended to sides and a top side of the transparent conductive layer.

The passivation layer may be formed of an insulating material.

The passivation layer may be formed of a non-conductive oxide or a non-conductive nitride.

The passivation layer may be disposed at a portion of a side of the second conduction type semiconductor layer, with an open region in the side of the second conduction type semiconductor layer.

In another embodiment, a lighting system includes a first lead frame and a second lead frame, a light emitting device package having the light emitting device, a circuit board for supplying a current to the light emitting device package, and an optical member for forwarding a light from the light emitting device package.

BRIEF DESCRIPTION OF THE DRAWINGS

Arrangements and embodiments may be described in detail with reference to the following drawings in which like reference numerals refer to like elements and wherein:

FIG. 6 is a view illustrating a light emitting device in accordance with another embodiment.

FIGS. 7 to 13 are views illustrating the steps of a method for fabricating the light emitting device in FIG. 1 in accordance with one embodiment.

DESCRIPTION OF SPECIFIC EMBODIMENTS

Hereinafter, embodiments will be described with reference to the annexed drawings.

It will be understood that when an element is referred to as being 'on' or "under" another element, it can be directly on/under the element, and one or more intervening elements may also be present. When an element is referred to as being 'on' or 'under', 'under the element' as well as 'on the element' can be included based on the element.

Figure 1A:
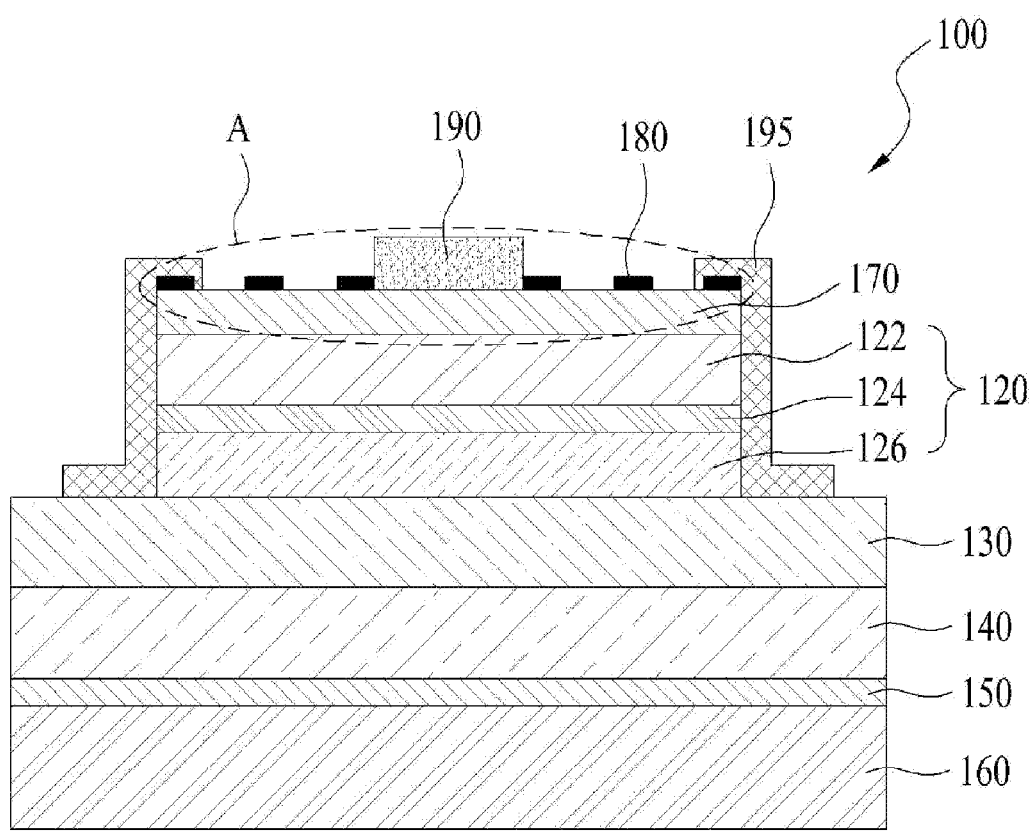
FIGS. 1A to 1C are views each illustrating a light emitting device in accordance with one embodiment.

FIG. 1A is a view illustrating a light emitting device in accordance with one embodiment.

Referring to FIG. 1A, the light emitting device 100 includes, on a metal support 160, a bonding layer 150, a reflective layer 140, an ohmic layer 130, a light emitting structure 120, and a transparent conductive layer 170 having a metal filter 180 patterned thereon.

In these embodiments or other embodiments, the light emitting device 100 may be semiconductor light emitting device, for example light emitting diode.

Since the metal support 160 can serve as a second electrode, the metal support 160 may be formed of a metal having good electric conductivity, and, since the metal support 160 is required to dissipate heat generated during operation of the light emitting device adequately, the metal support 160 may be formed of a metal having good heat conductivity.

The metal support 160 may be formed of a material selected from a group of materials including Mo, Si, W, Cu and Al, or an alloy of above, and may include Au, a Cu Alloy, Ni, Cu—W, a carrier wafer (For an example: GaN, Si, Ge, GaAs, ZnO, SiGe, SiC, SiGe, $Ga_2O_3$ and so on), selectively.

And, the metal support 160 may have enough mechanical strength to be split into individual chips by scribing and breaking while causing no bending of an entire nitride semiconductor.

The bonding layer 150 bonds the reflective layer 140 to the metal support 160, and the reflective layer 140 may serve as an adhesion layer. The bonding layer 150 may be formed of a material selected from a group of materials including Au, Sn, In, Ag, Ni, Nb and Cu, or an alloy of above.

The reflective layer 140 may have a thickness of about 2500 Å. The reflective layer 140 may be constructed of a metal layer including an alloy of aluminum (Al), silver (Ag), nickel (Ni), platinum |(Pt), |[b1] and rhodium (Rh), or an alloy including aluminum (Al), silver (Ag), platinum (Pt), or rhodium (Rh). Aluminum (Al) or silver (Ag) makes effective reflection of the light from the active layer 124 to improve light extraction efficiency of the light emitting structure, significantly.

Since the light emitting structure 120, particularly, the second conduction type semiconductor layer 126, has light impurity doping concentration to have high contact resistance and a poor ohmic characteristic, in order to improve the ohmic characteristic, the ohmic layer 130 may be formed to be transparent.

The ohmic layer 130 may have a thickness of about 200 Å. The ohmic layer 130 may be formed of a material including at least one selected from, but not limited to, ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IZON (IZO Nitride), AGZO (Al—Ga ZnO), IGZO (In—Ga ZnO), ZnO, IrOx, RuOx, NiO, RuOx/ITO, and Ni/IrOx/Au, and Ni/IrOx/Au/ITO, Ag, Ni, Cr, Ti, Al, Rh, Pd, Ir, Sn, In, Ru, Mg, Zn, Pt, Au, and Hf.

The light emitting structure 120 is formed on the first conduction type semiconductor layer 122, to include an active layer 124 which emits a light and a second conduction type semiconductor layer 126 disposed on the active layer 124.

The first conductive type semiconductor layer 122 may be embodied with a III-V group compound semiconductor doped with first conduction type dopant, and, if the first conduction type semiconductor layer 122 is an N type semiconductor layer, the first conduction type dopant may include, but not limited to, Si, Ge, Sn, Se, and Te as an N type dopant.

The first conduction type semiconductor layer 122 may include a semiconductor material having composition of $Al_xIn_yGa_{(1-x-y)}N$ ($0 \leq x \leq 1$, $0 \leq y \leq 1$, $0 \leq x+y \leq 1$). And, the first conductive type semiconductor layer 122 may be formed of at least one selected from a group of materials including GaN, InN, AlN, InGaN, AlGaN, InAlGaN, AlInN, AlGaAs, InGaAs, AlInGaAs, GaP, AlGaP, InGaP, AlInGaP, InP.

The active layer 124 is a layer which emits the light having energy fixed by an energy bandgap unique to a material of the active layer (a light emitting layer) as an electron injected thereto through the first conductive type semiconductor layer 122 and a hole injected thereto through the second conductive type semiconductor layer 126 to be formed later meet with each other, and, besides the visible light band, the active layer 124 may emit a light of an UV light band.

The active layer 124 may be formed as at least one of single quantum well structure, MQW (Multi Quantum Well) structure, a Quantum-Wire structure, or a Quantum dot structure. For an example, the active layer 124 may be formed as the MQW (Multi Quantum Well) structure by injection of, but not limited to, TMGa gas, $NH_3$ gas, $N_2$ gas, and TMIn gas.

The active layer 124 has a pair structure of well layer/barrier layer constructed of at least any one of, but not limited to, InGaN/GaN, InGaN/InGaN, AlGaN/GaN, InAlGaN/GaN, GaAs/AlGaAs (InGaAs), and GaP/AlGaP (InGaP). The well layer may be formed of a material having a bandgap lower than a bandgap of the barrier layer.

There may be a conductive clad layer (Not shown) disposed on or/and underside of the active layer 124. The conductive clad layer may be formed of an AlGaN group semiconductor to have an energy bandgap higher than the energy bandgap of the active layer 124.

The second conduction type semiconductor layer 126 may include a III-V group compound semiconductor doped with second conductive type dopant, for an example, a semiconductor having composition of $In_xAl_yGa_{1-x-y}N$ ($0 \leq x \leq 1$, $0 \leq y \leq 1$, $0 \leq x+y \leq 1$). If the second conduction type semiconductor layer 126 is a P type semiconductor layer, the second conduction type dopant may include Mg, Zn, Ca, Sr, and Ba as a P type dopant.

In the meantime, the first conduction type semiconductor layer 122 may include the P type semiconductor layer, and the second conduction type semiconductor layer 126 may include the N type semiconductor layer.

The transparent conductive layer 170 may be disposed on the light emitting structure 120 of a translucent material, such as ITO. The metal filer 180 may be disposed on the transparent conductive layer 170 in a form of a pattern of a metal, such as aluminum or titanium, for serving as an optical block portion for reflecting the light from the light emitting structure 120.

The metal filter 180 may have a thickness of 1 micron to 10 microns, and detail of which will be described later.

There may be a first electrode 190 disposed on the transparent conductive layer 170 and/or the metal filter 180 in single layer or multiple layer of a material including at least one of Al, Ti, Cr, Ni, Cu, and Au.

And, there may be a roughness (Not shown) disposed on a surface of the light emitting structure 120, on a surface of the first conduction type semiconductor layer 122, for enhancing light extraction efficiency.

And, there may be a passivation layer 195 disposed at a side of the light emitting structure 120.

The passivation layer 195 may be formed of an insulating material, and the insulating material may be a non-conductive oxide or nitride. As an example, the passivation layer 195 may be constructed of a silicon oxide $SiO_2$ layer, a silicon nitride layer, or an aluminum oxide layer.

Figure 1B:
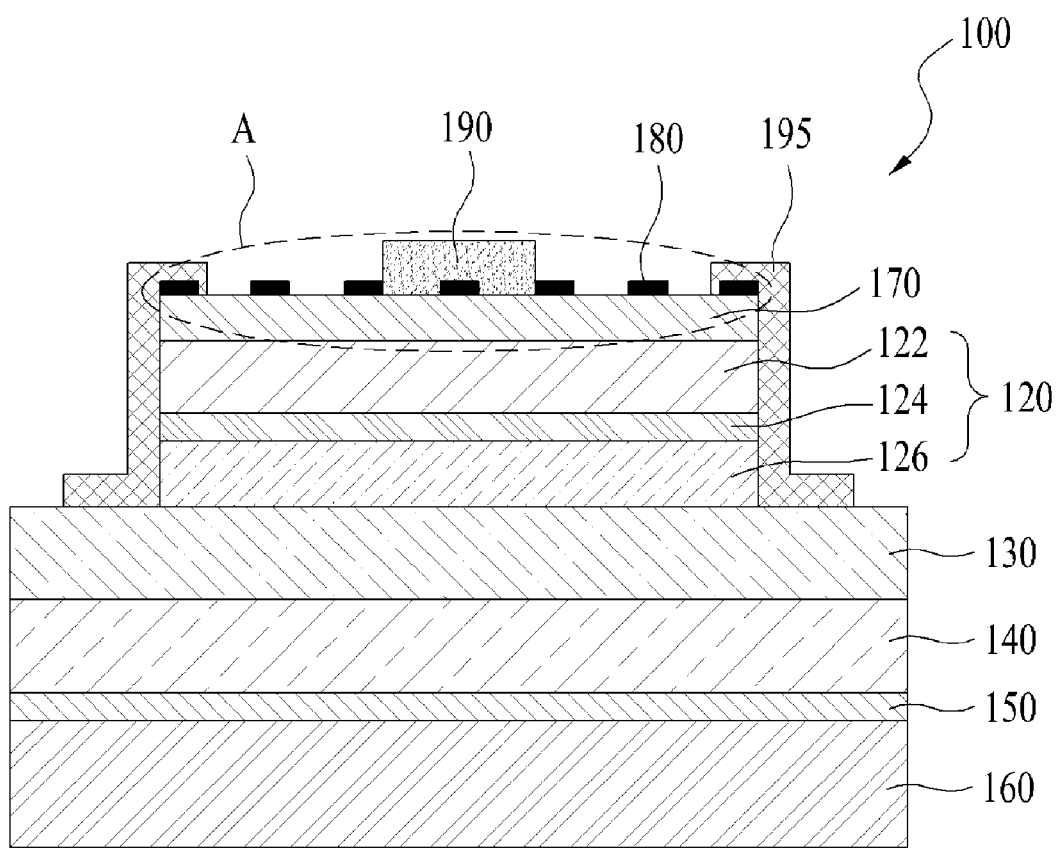

Though similar to the embodiment illustrated in FIG. 1A, an embodiment illustrated in FIG. 1B has a first electrode 190 in contact both with the transparent conductive layer 170 and the metal filter 180.

Figure 1C:
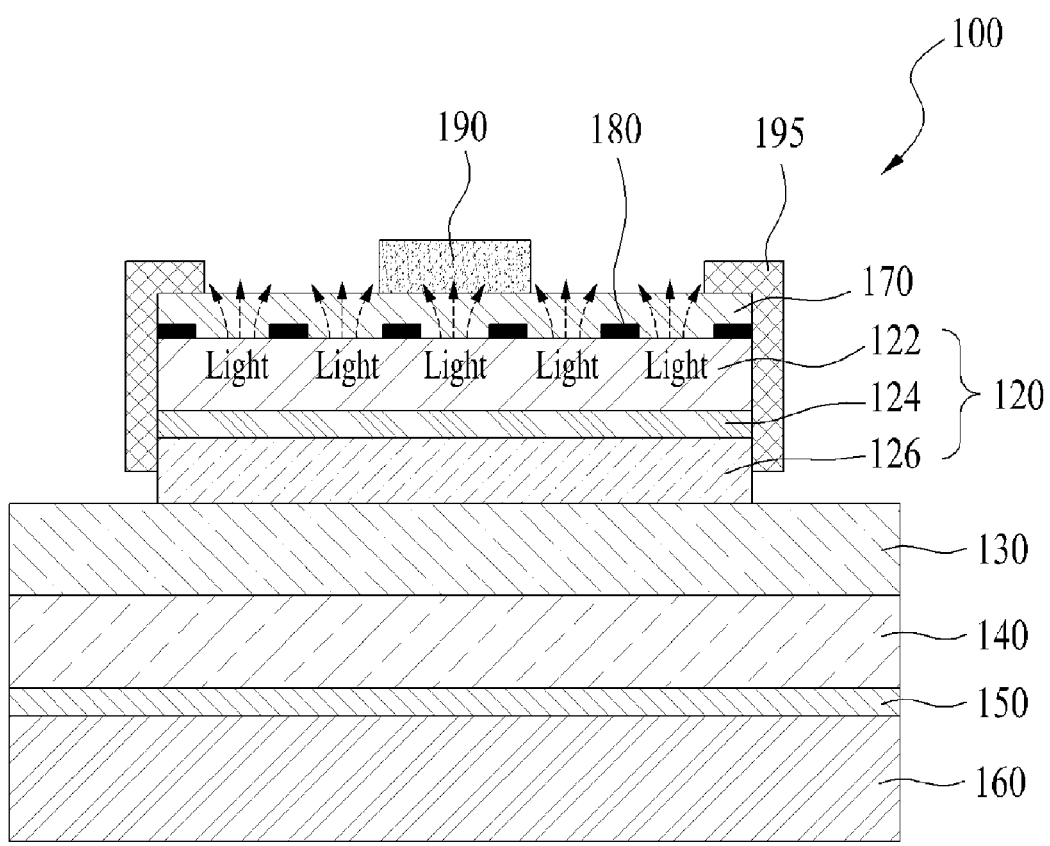

An embodiment illustrated in FIG. 1C has the passivation layer 195 disposed at a portion of the second conduction type semiconductor layer 126 to form an open region B in a surface of the second conduction type semiconductor layer 126.

FIGS. 2A to 4 are views each illustrating a metal filter structure of a light emitting device. FIGS. 2A to 4 show an 'A' part in FIG. 1 seen from above while omitting the electrode and the passivation layer to show the transparent conductive layer 170 and the metal filter 180.

Figure 2A:
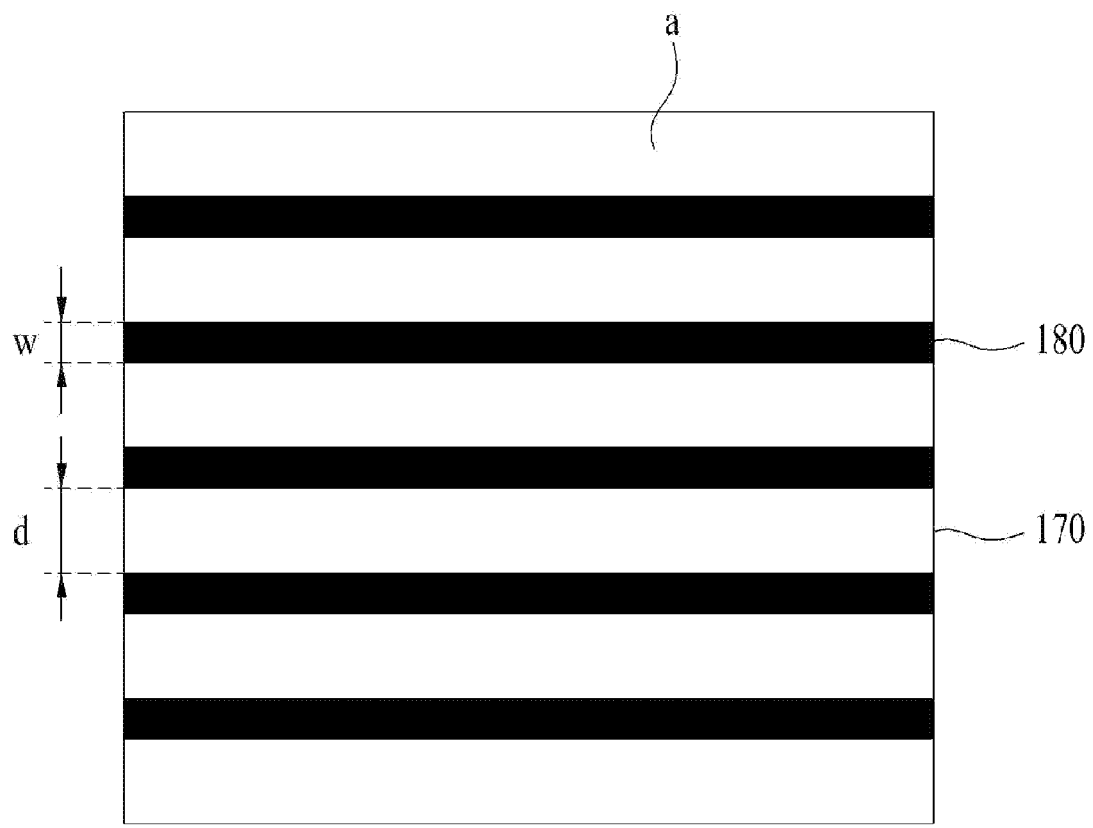
FIGS. 2A to 4 are views each illustrating a metal filter structure of a light emitting device.

The transparent conductive layer 170 may be formed of a translucent material, such as ITO, or the transparent conductive layer may be omitted, to dispose the metal filter 180 on the light emitting structure. The metal filter 180 is disposed in a form of stripes as shown in FIG. 2A. A region a having no metal filter 180 disposed thereon is an opening.

The metal filter 180 which forms above pattern may have a width w which is 10% to 20% of a width d of the opening. If the width w of the metal filter 180 is large excessively, light transmissivity is liable to become poor, and if the width d of the opening is large excessively, making refraction of the light unfavorable, the light transmissivity is liable to become poor.

Figure 2B:
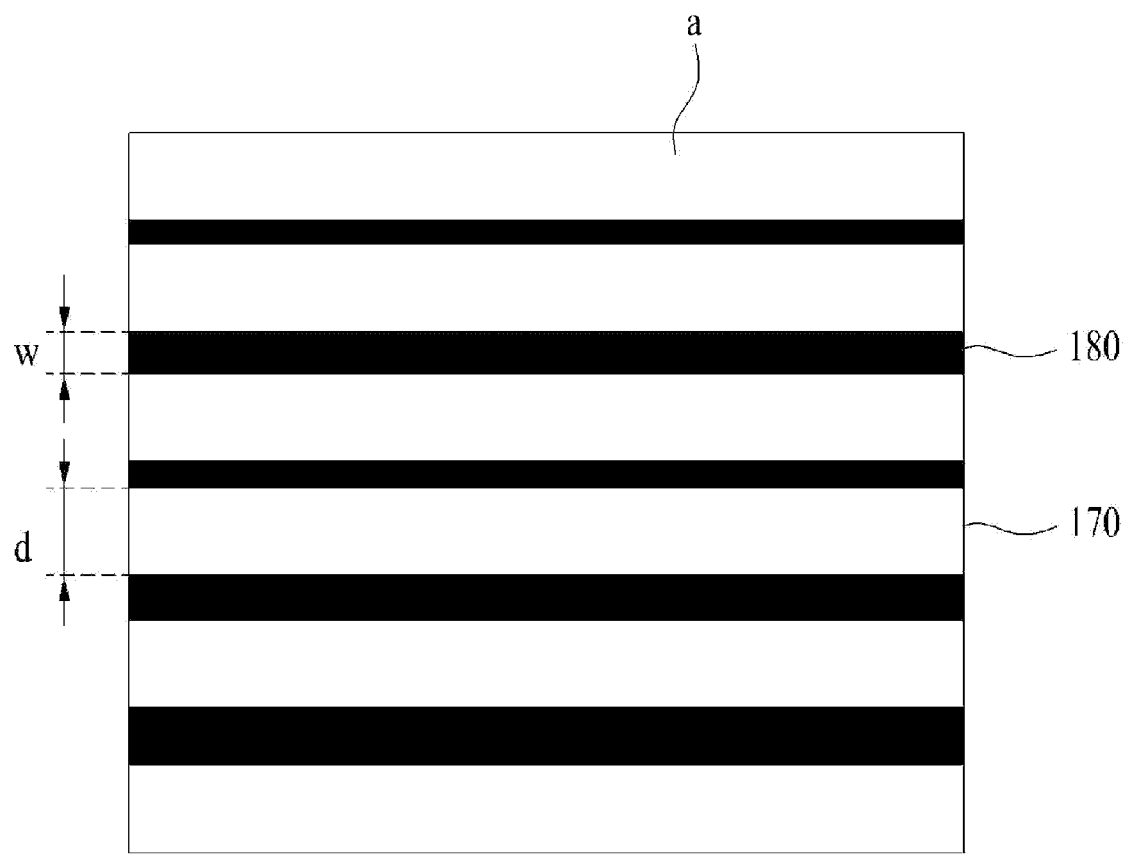
Figure 2C:
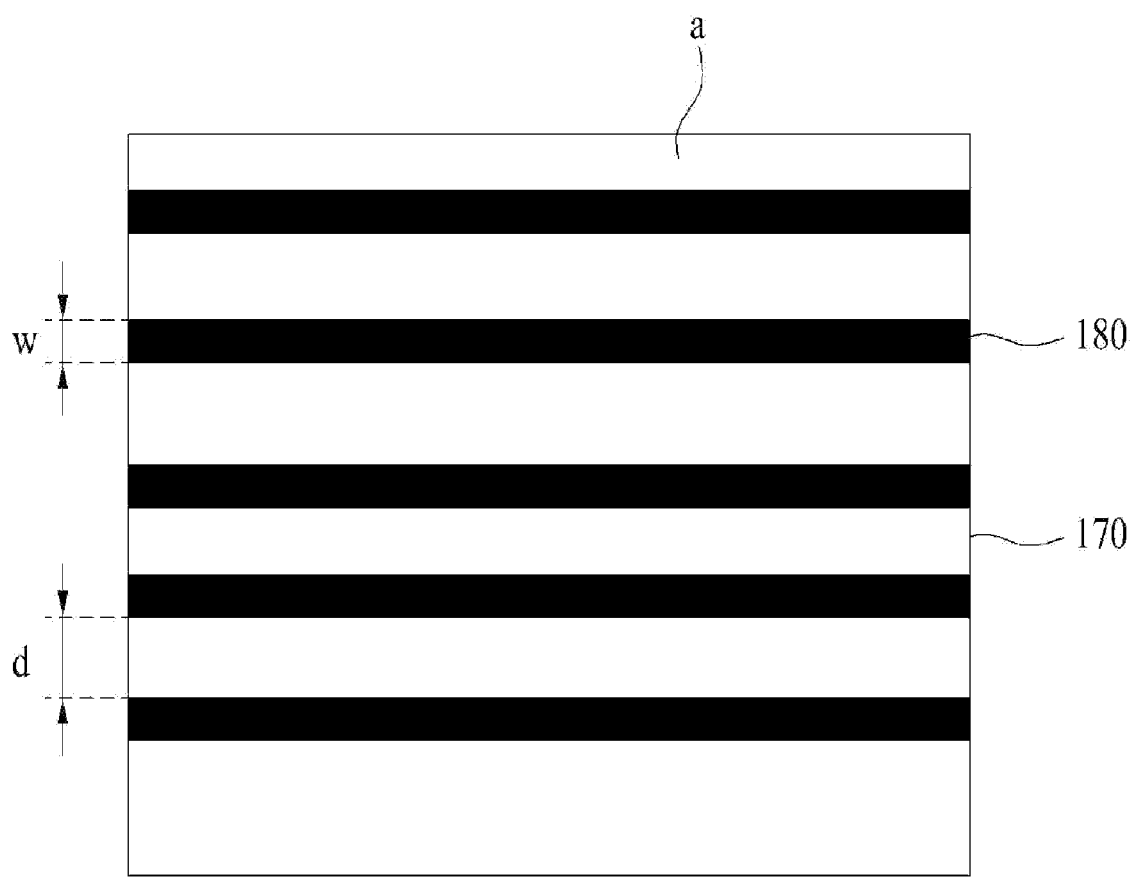

An embodiment illustrated in FIG. 2B shows the metal filter 180 having irregular widths w, and the opening a having regular widths d. An embodiment illustrated in FIG. 2C shows the metal filter 180 having regular widths w, and the opening a having irregular widths d. In another embodiment, both the widths w and the widths d may be irregular. The light from the active layer in the light emitting device does not make regular incident on the metal filter 180. Therefore, the metal filter 180 having the irregular pattern can diffuse the light toward an upper side of the light emitting device.

Figure 2D:
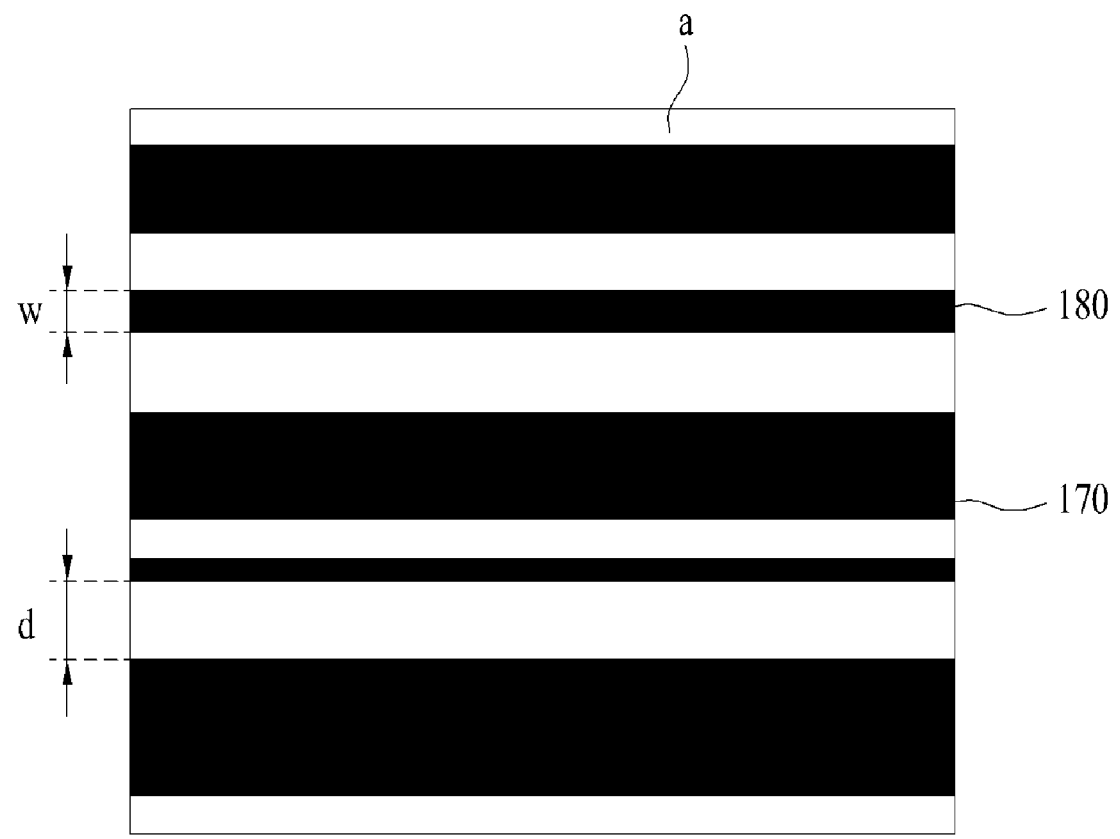

An embodiment illustrated in FIG. 2D shows the metal filter 180 having irregular widths w, and the opening a having irregular widths d.

Figure 2E:
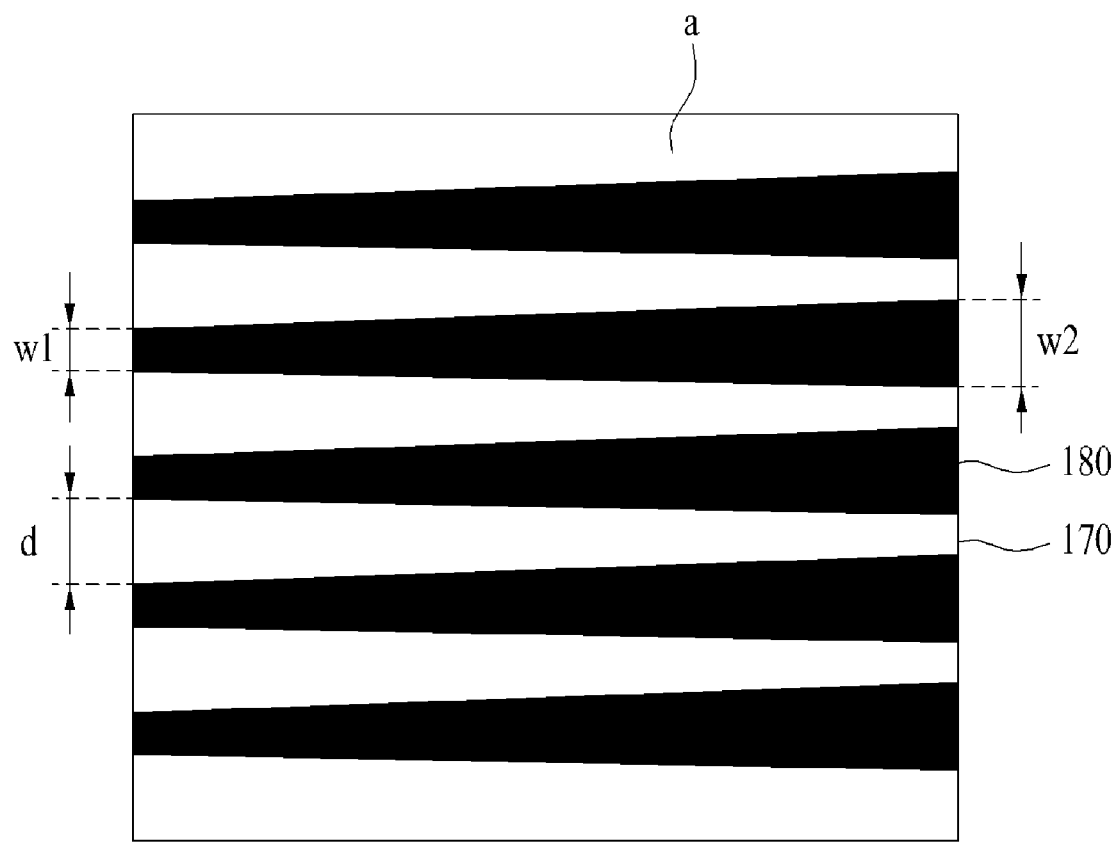

An embodiment illustrated in FIG. 2E shows the metal filter 180 having a pattern with widths w1 in one side and widths w2 in the other side different from each other to provide non-uniform pattern widths.

Embodiments illustrated in FIGS. 3A to 3E show the metal filters 180 patterned in mesh types, respectively. In this instance, as described before, the width w of the metal filter 180 may be 10 to 20% of the width d of the opening.

Figure 3A:
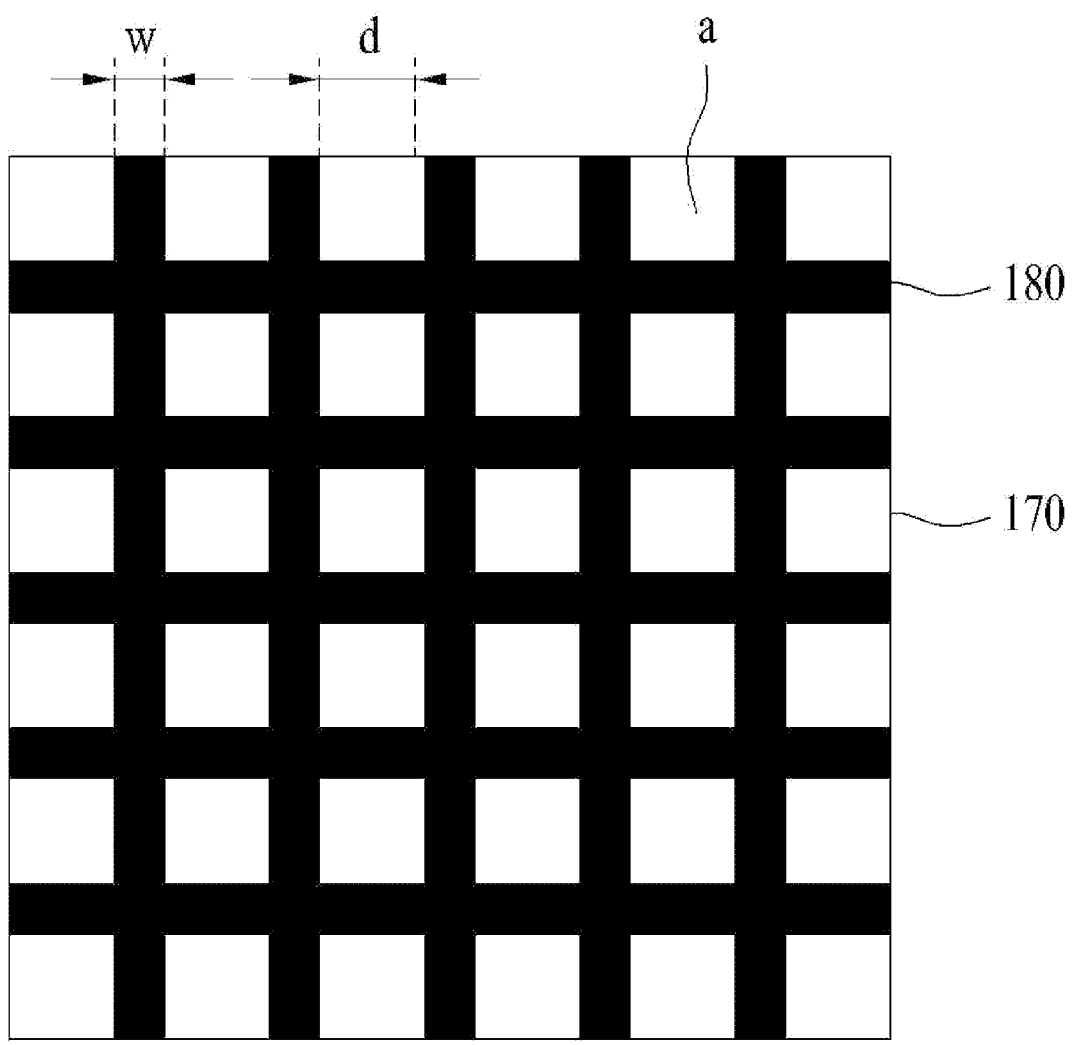
Figure 3B:
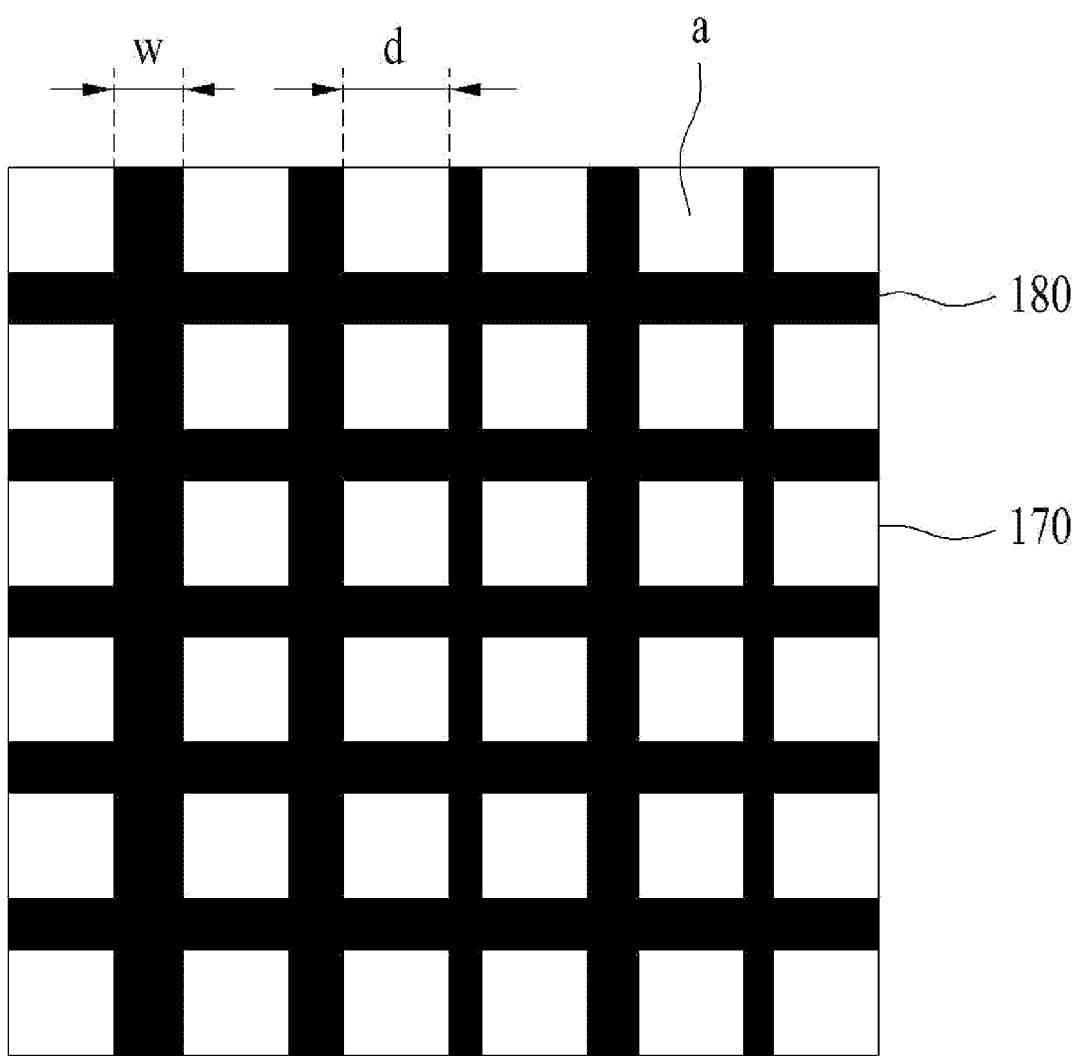
Figure 3C:
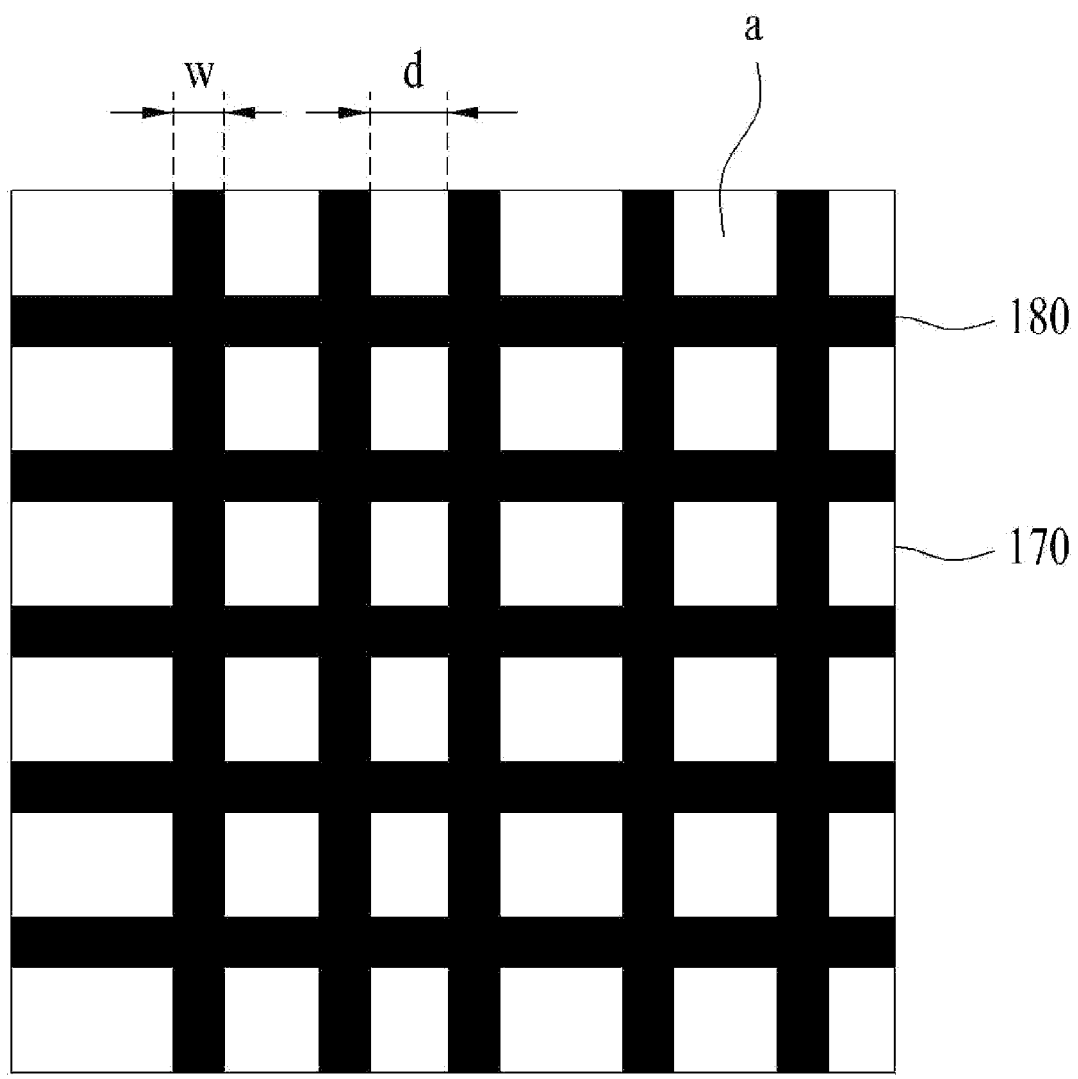

And, an embodiment illustrated in FIG. 3A shows the metal filter 180 with regular widths w and the opening a with regular widths d, an embodiment illustrated in FIG. 3B shows the metal filter 180 with irregular widths w and the opening a with regular widths d, an embodiment illustrated in FIG. 3C shows the metal filter 180 with regular widths w and the opening a with irregular widths d, and another embodiment may show the metal filter 180 with irregular widths w and the opening a with irregular widths d.

Figure 3D:
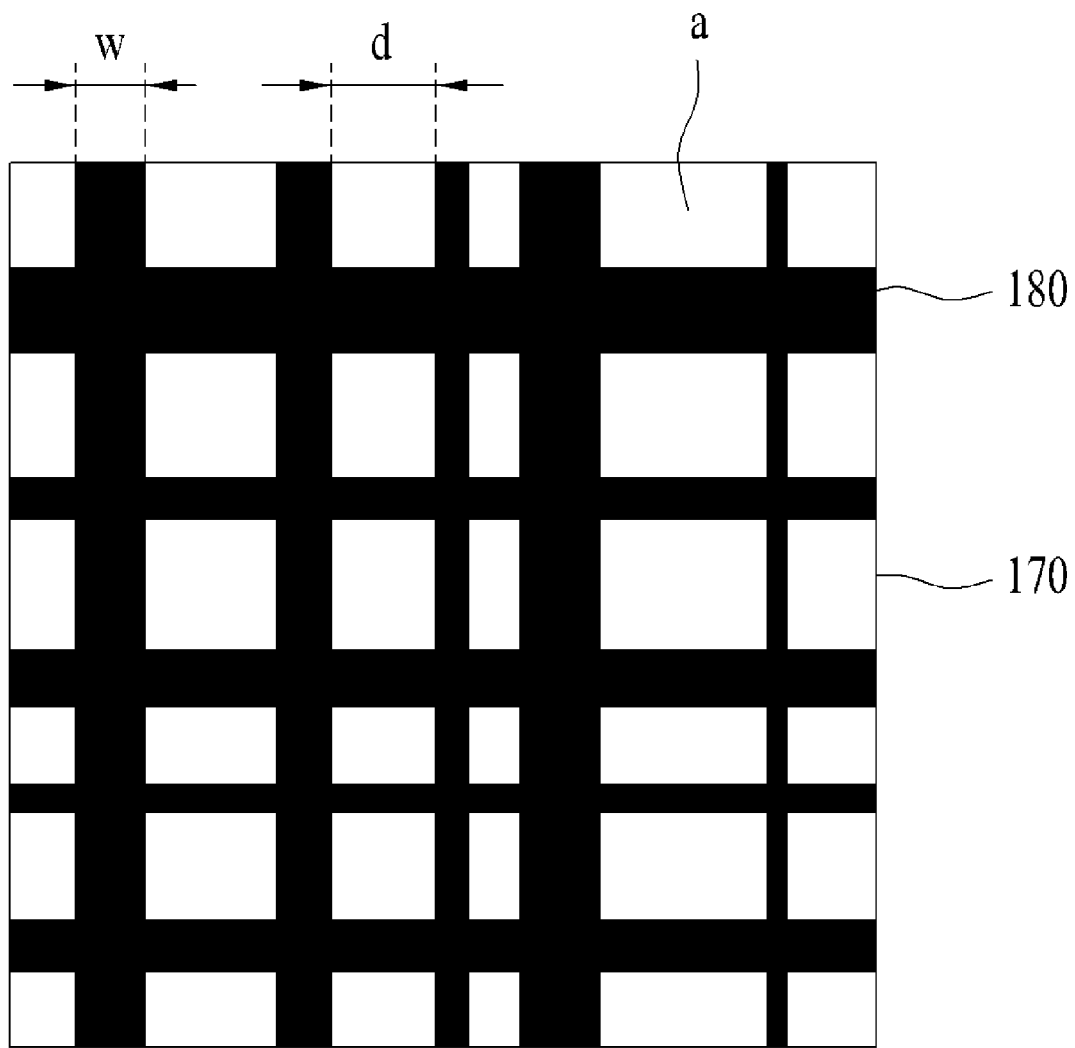

An embodiment illustrated in FIG. 3D shows the metal filter 180 with irregular widths w and the opening a with irregular widths d.

Figure 3E:
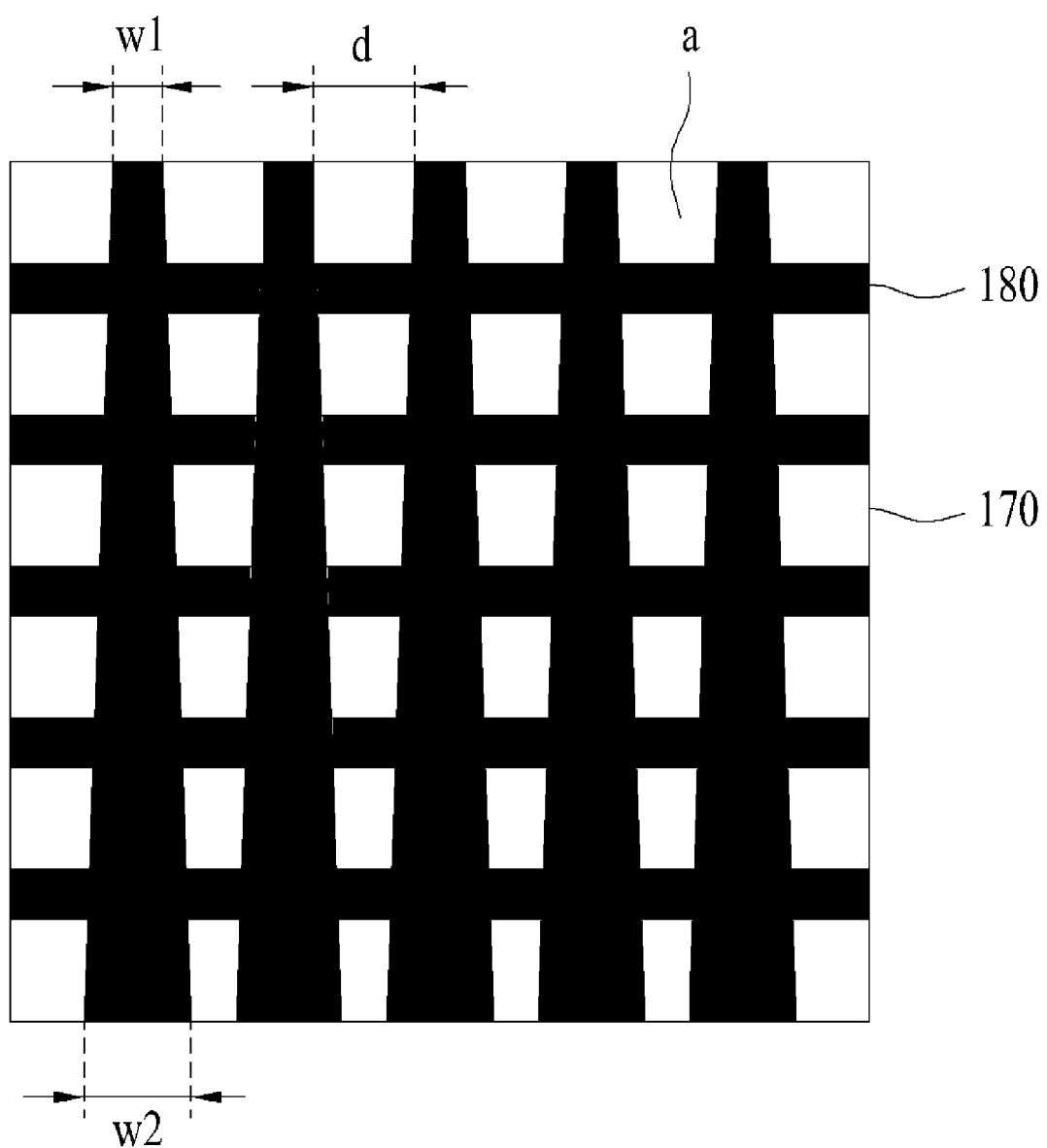
Figure 4:
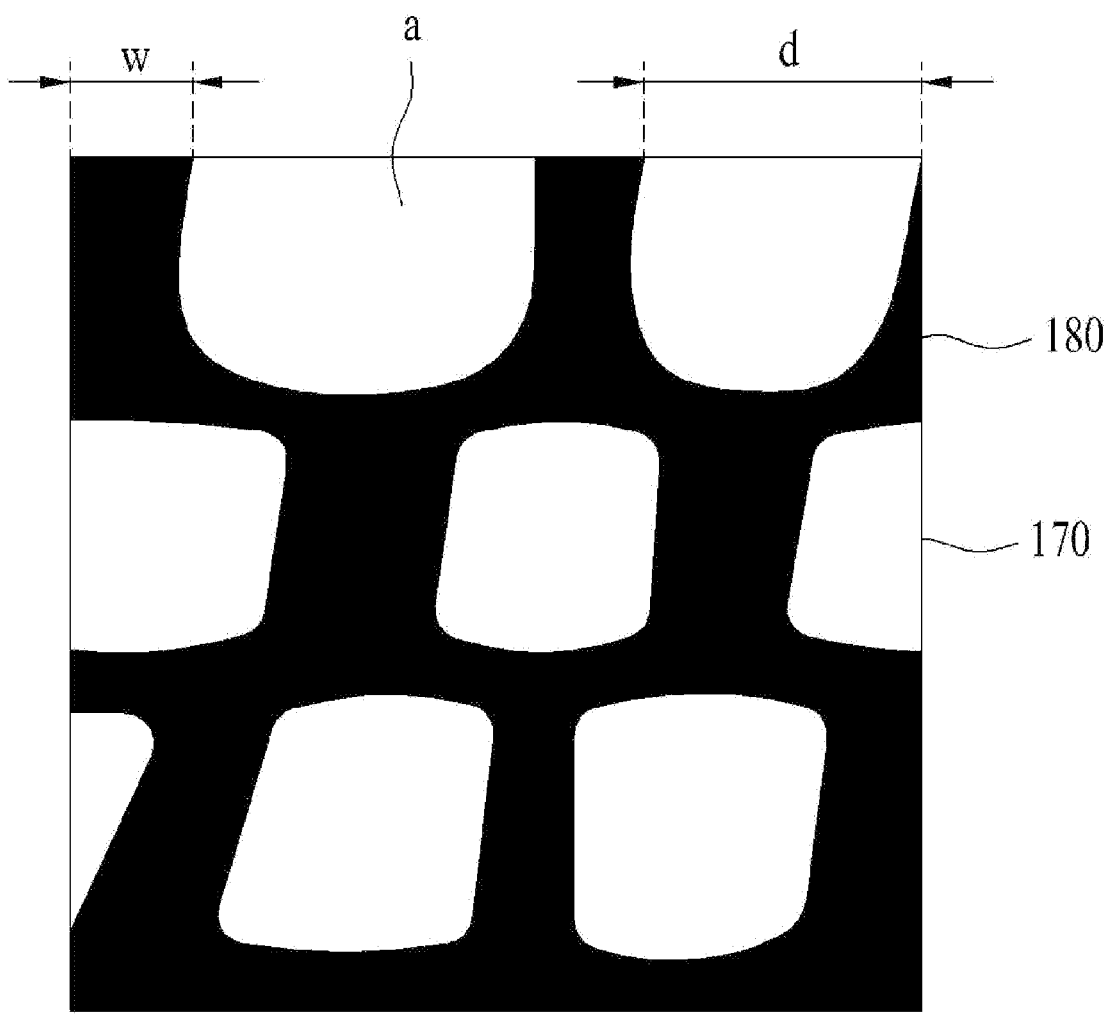

An embodiment illustrated in FIG. 3E shows the metal filter 180 having a pattern with a first side width w1 and a second side width w2 different from each other to provide non-uniform widths of the pattern. FIG. 4 illustrates the metal filter 180 having an irregular pattern and the opening a having an irregular pattern, with widths w or areas of the metal filter 180 to be 10% to 20% of the widths d or areas of the opening.

Figure 5A:
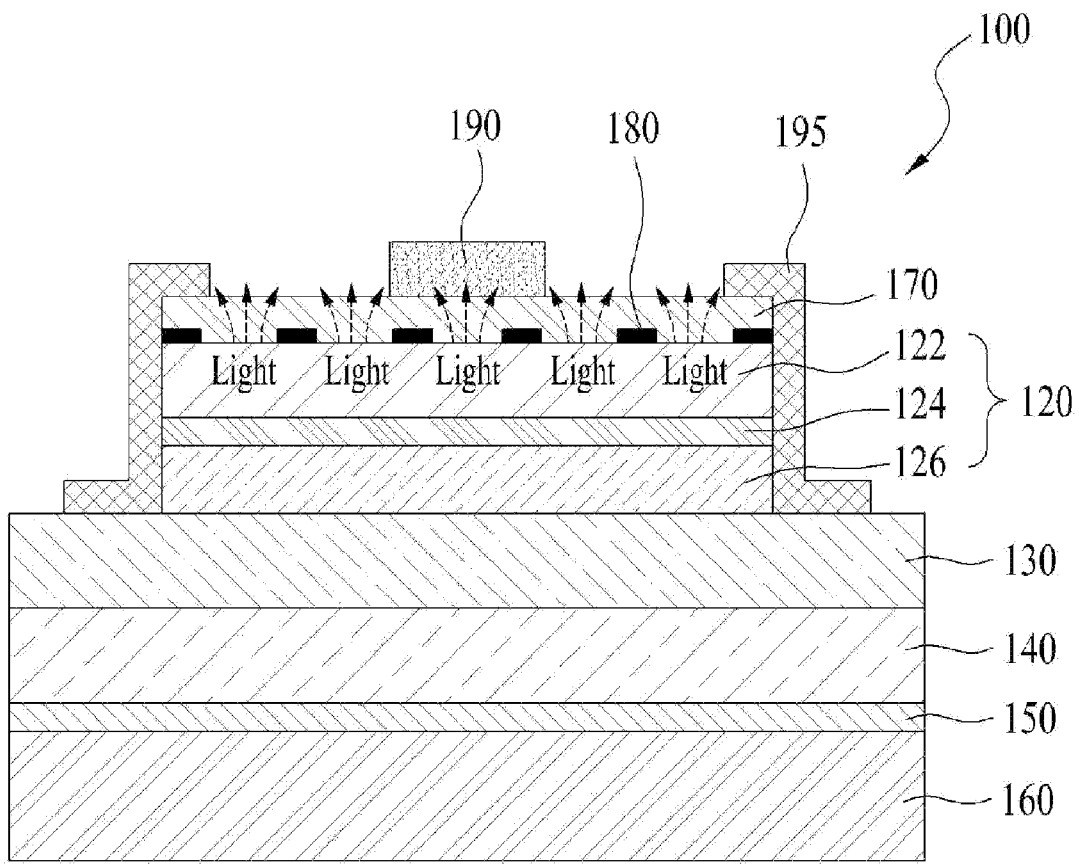
FIGS. 5A to 5C are views each illustrating another embodiment and operation of a light emitting device.
Figure 5B:
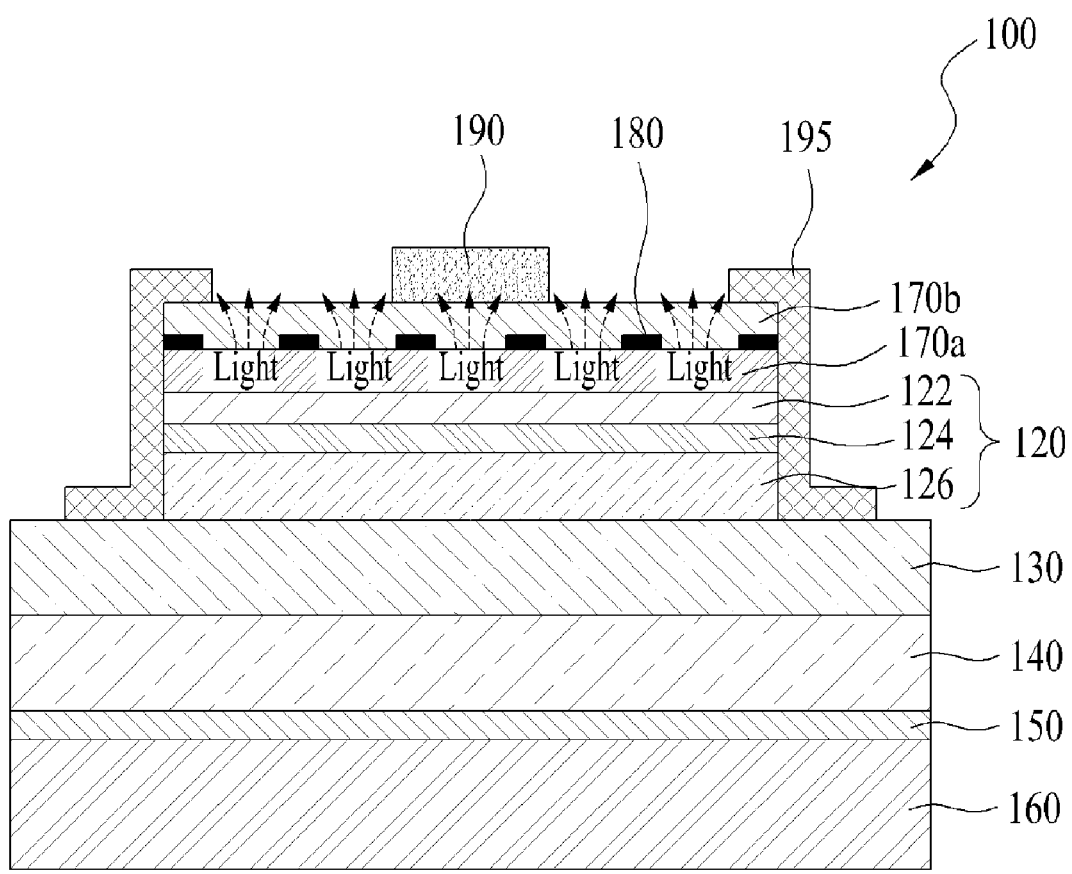
Figure 5C:
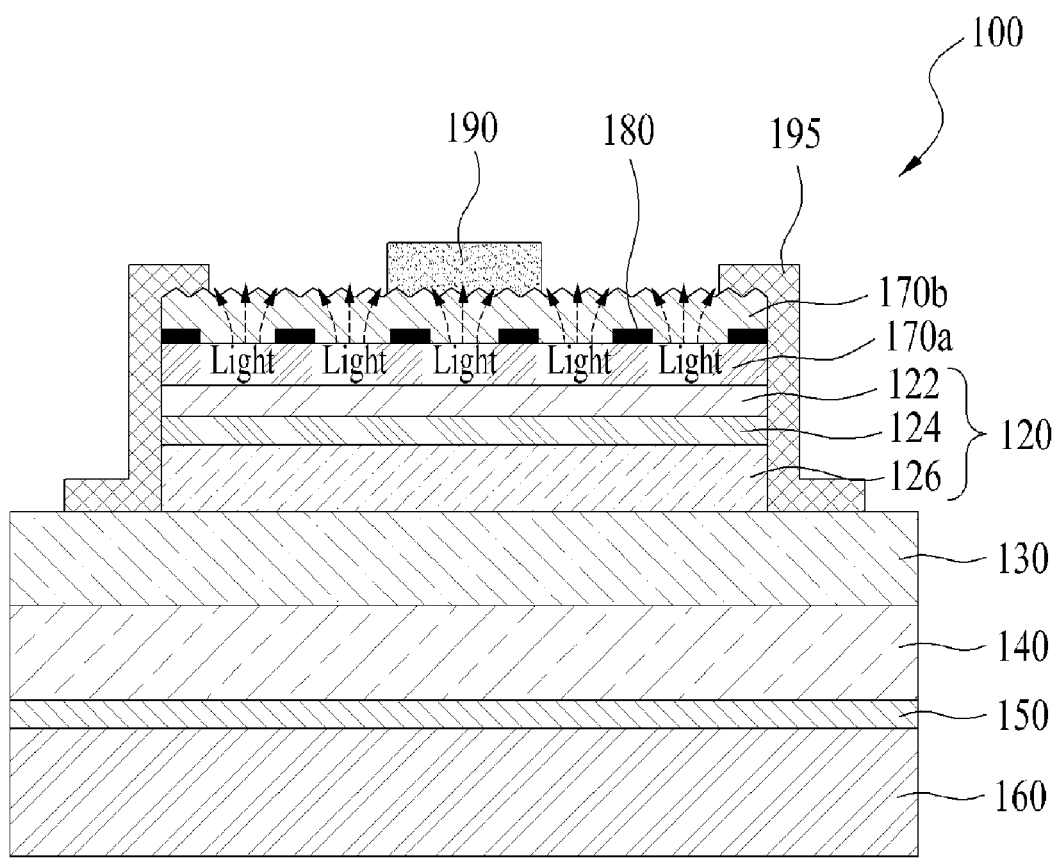

FIGS. 5A to 5C are views each illustrating other embodiment and operation of a light emitting device.

An embodiment illustrated in FIG. 5A shows the metal filter 180 disposed on a surface of the light emitting structure 120, i.e., a surface of the first conduction type semiconductor layer 122, and the transparent conductive layer 170 covered on the opening region and the metal filter 180.

The light from the light emitting structure 120 may be shielded by the metal filter 180, or travels upward through the openings between the metal filter 180. And, as shown, when the light passes the opening, since the light may reach to a back side of the metal filter 180 which is an obstacle, travelling away from a geometrical optic straight path according to a principle of refraction, the light can be emitted throughout an entire surface of the light emitting device 100.

An embodiment illustrated in FIG. 5B has a first transparent conductive layer 170a on a surface of the light emitting structure 120, i.e., a surface of the first conduction type semiconductor layer 122, the metal filter 180 on a surface of the first transparent conductive layer 170a, and a second transparent conductive layer 170b to cover the first transparent conductive layer 170a and the metal filter 180.

Though similar to FIG. 5B, an embodiment illustrated in FIG. 5C has a roughness disposed on the surface of the first conduction type semiconductor layer 122 for widening an angle of outward light emission from the active layer 124. FIG. 6 is a view illustrating a light emitting device in accordance with another embodiment.

FIG. 6 illustrates a horizontal type light emitting device having the second conduction type semiconductor layer 126, the active layer 124, and a portion of the first conduction type semiconductor layer 122 subjected to MESA etching to expose a portion of the first conduction type semiconductor layer 122. That is, if the substrate 110 is formed of an insulating material, a portion of the first conduction type semiconductor layer 122 is exposed for securing a space for forming an electrode required for supplying a current to a portion of the first conduction type semiconductor layer 122.

A buffer layer 115 may be disposed between the light emitting structure 120 and the substrate 110 for moderating lattice mismatch and a difference of thermal expansion coefficients of materials between the light emitting structure 120 to be described later and the substrate 110. The buffer layer 115 may be formed of a III-V group compound semiconductor, for an example, at least one of GaN, InN, AlN, InGaN, AlGaN, InAlGaN, and AlInN.

And, a second electrode 195 and a first electrode 190 are disposed on the second conduction type semiconductor layer 126 and the first conduction type semiconductor layer 122 exposed thus, respectively. Both the first electrode 190 and the second electrode 195 may be a single or multiple layered structure of at least one of Al, Ti, Cr, Ni, Cu, and Au.

FIGS. 7 to 13 are views illustrating the steps of a method for fabricating the light emitting device in FIG. 1 in accordance with one embodiment.

Referring to FIG. 7, a light emitting structure 120 is disposed on a substrate 110 to include a buffer layer 115, a first conduction type semiconductor layer 122, an active layer 124, and a second conduction type semiconductor layer 126.

The light emitting structure 126 may be formed by, but not limited to, MOCVD (Metal Organic Chemical Vapor Deposition), CVD (Chemical Vapor Deposition), PECVD (Plasma-Enhanced Chemical Vapor Deposition), MBE (Molecular Beam Epitaxy), and HVPE (Hydride Vapor Phase Epitaxy).

The substrate 110 may be a conductive or insulating substrate, for an example, at least one of, sapphire $Al_2O_3$, SiC, Si, GaAs, GaN, ZnO, Si, GaP, InP, Ge, and $Ga_2O_3$. A roughness structure may be disposed on, but not limited to, the substrate 110. The substrate 110 may be subjected to wet washing, to remove impurity from a surface thereof.

A buffer layer (Not shown) may be grown between the light emitting structure and the substrate 110 for moderating lattice mismatch and a difference of thermal expansion coefficients of materials. The buffer layer may be formed of a III-V group compound semiconductor, for an example, at least one of GaN, InN, AlN, InGaN, AlGaN, InAlGaN, and AlInN. An undoped semiconductor layer may be disposed on the buffer layer, but not limited to this.

The light emitting structure may be grown by vapor deposition, such as MOCVD (Metal Organic Chemical Vapor Deposition), MBE (Molecular Beam Epitaxy), and HVPE (Hydride Vapor Phase Epitaxy).

The first conduction type semiconductor layer 122 has composition as described before, and can be formed as an N type GaN layer by CVD, MBE, sputtering, or HYPE. And, the first conduction type semiconductor layer 122 may be formed by injecting silane gas $SiH_4$ including n type impurities, such as TMGa, $NH_3$, $N_2$, and Si, into a chamber.

The active layer 124 has composition as described before, and can be formed as an MQW (Multi Quantum Well) structure by injecting, but not limited to, TMGa gas, $NH_3$ gas, $N_2$ gas, and TMIn gas.

The second conduction type semiconductor layer 126 has composition as described before, and can be formed as a p type GaN layer by injecting $(EtCp_2Mg)\{Mg(C_2H_5C_5H4)_2\}$ including p type impurities, such as TMGa gas, $NH_3$ gas, $N_2$ gas, and magnesium into a chamber, but not limited to this.

Figure 8:
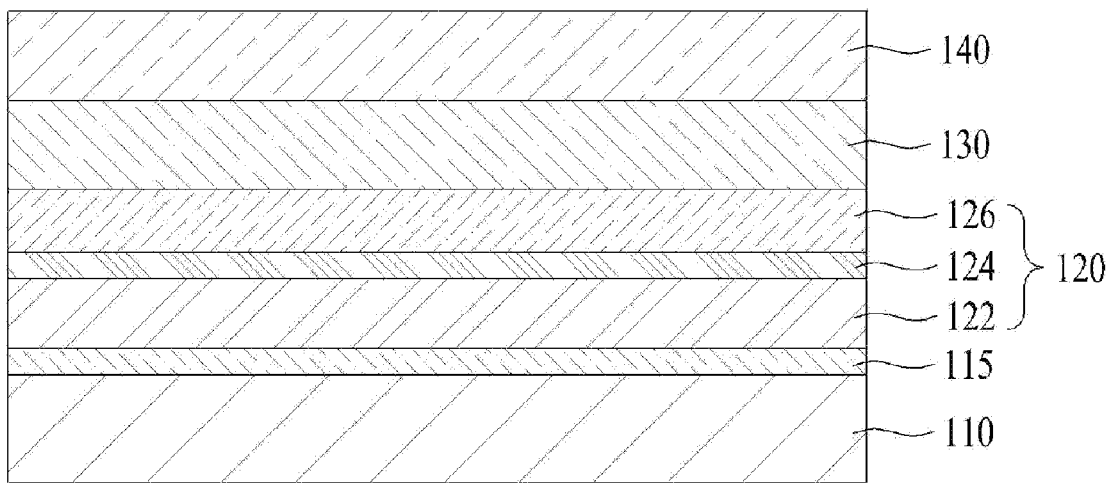

And, referring to FIG. 8, an ohmic layer 130 and a reflective layer 140 may be disposed on the light emitting structure 120. The ohmic layer 130 and the reflective layer 140 have composition as described before, and may be formed by sputtering or MBE.

If the ohmic layer 130 is formed of ITO, transmission efficiency of a UV beam from the active layer 124 may become poor, and the ohmic layer 130 may be formed of Ni/Au.

Figure 9:
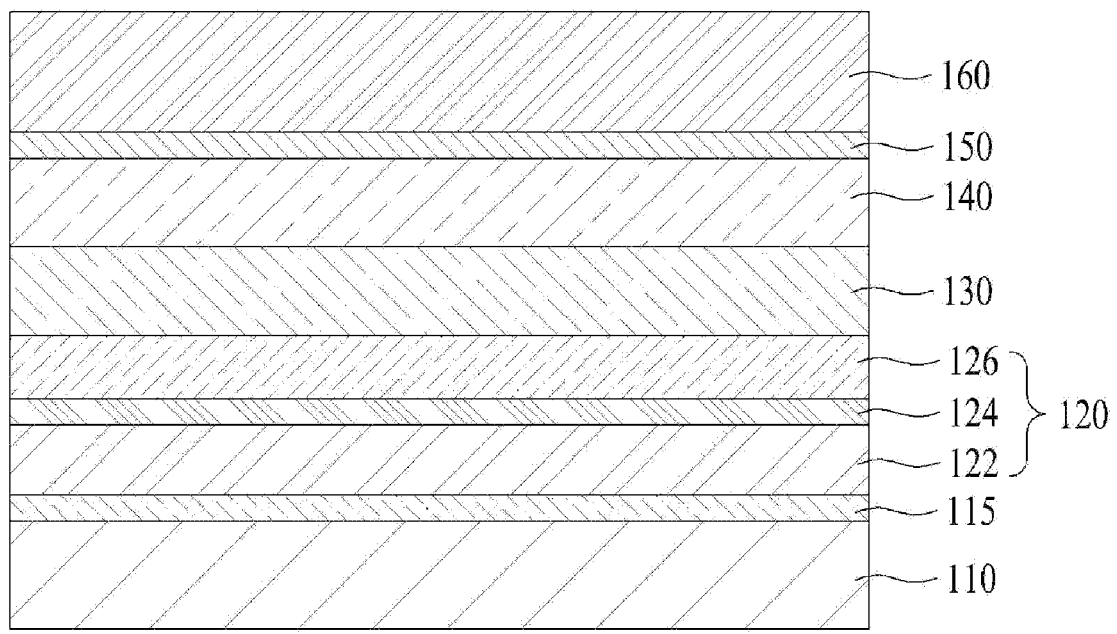

And, referring to FIG. 9, a bonding layer 150 and a metal support 160 may be disposed on the reflective layer 140. The metal support 160 may be formed by electro-chemical metal deposition, or bonding by using a eutectic metal, or a separate adhesion layer 160 may be formed.

Figure 10:
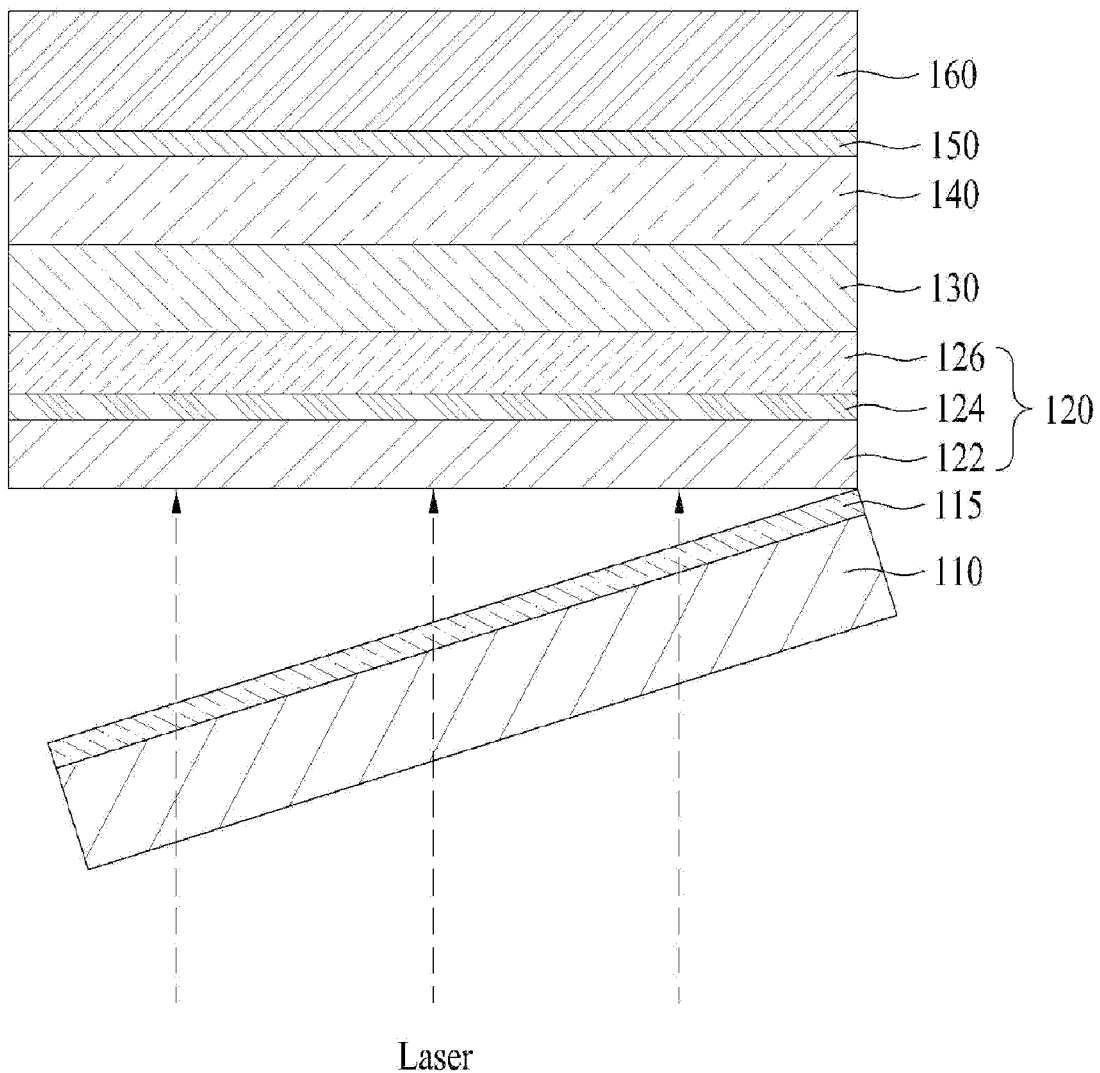

Then, referring to FIG. 10, the substrate 110 is separated. The substrate 110 may be separated by laser lift off (LLO) by using an excimer laser, or dry or wet etching.

In the laser lift off, if an excimer laser beam of a predetermined wavelength band is focused toward, for an example, the substrate 110, focusing thermal energy at a boundary of the substrate 110 and the light emitting structure 120 to separate gallium molecules from nitrogen molecules, the substrate 110 is separated instantly at a portion the laser beam passes.

Figure 11:
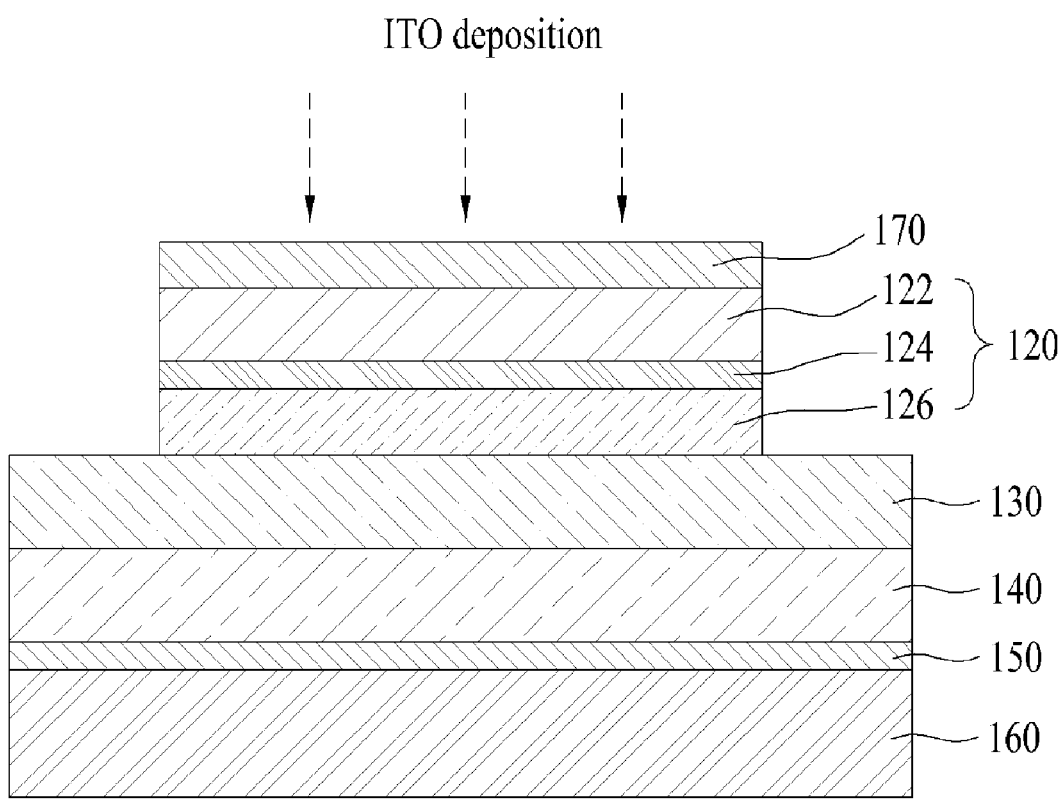

Then, referring to FIG. 11, after dicing each of the light emitting devices, ITO may be deposited on the light emitting structure 120 as a transparent conductive layer 170.

Figure 12:
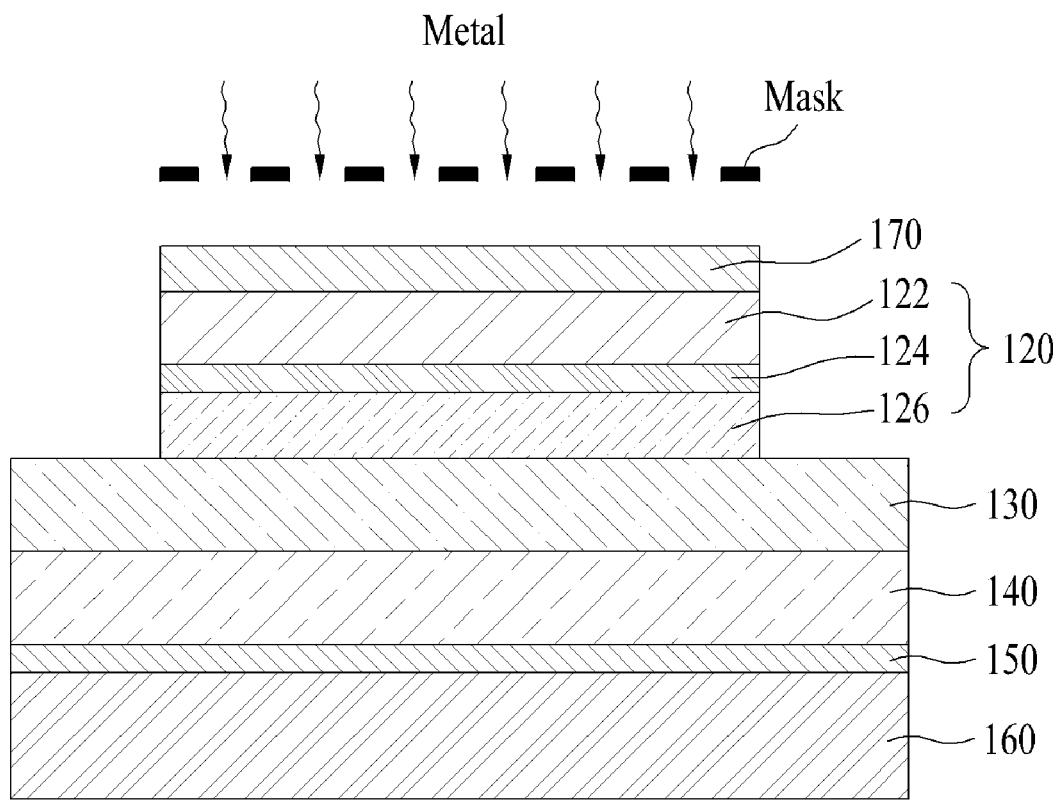

Then, referring to FIG. 12, a metal filter is disposed on the transparent conductive layer 170 by depositing and patterning metal with a mask, or depositing metal, such as aluminum or titanium, in a form of oxide.

Figure 13:
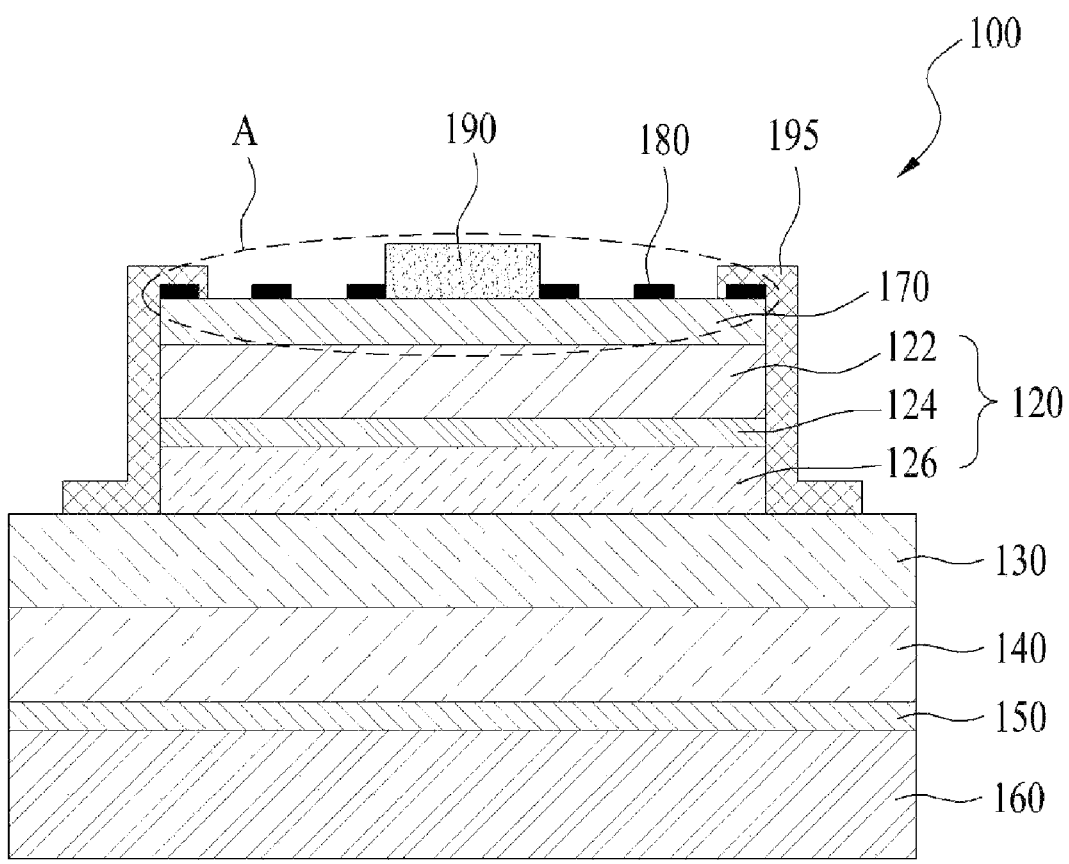

And, though not shown, a surface of the light emitting structure 120, i.e., a surface of the first conduction type semiconductor layer 122, may be etched to form a roughness structure thereon. And, as shown in FIG. 13, a passivation layer 195 may be deposited at a side of the light emitting structure 120, and a first electrode 190 may be disposed on the surface of the light emitting structure 120. The passivation layer 195 may be disposed to cover even a top side of the transparent conductive layer 170.

Since the light from the active layer can reach to a back side of the metal filter according to a principle of refraction, the light can be emitted throughout an entire surface of an upper side of the light emitting device.

Figure 14:
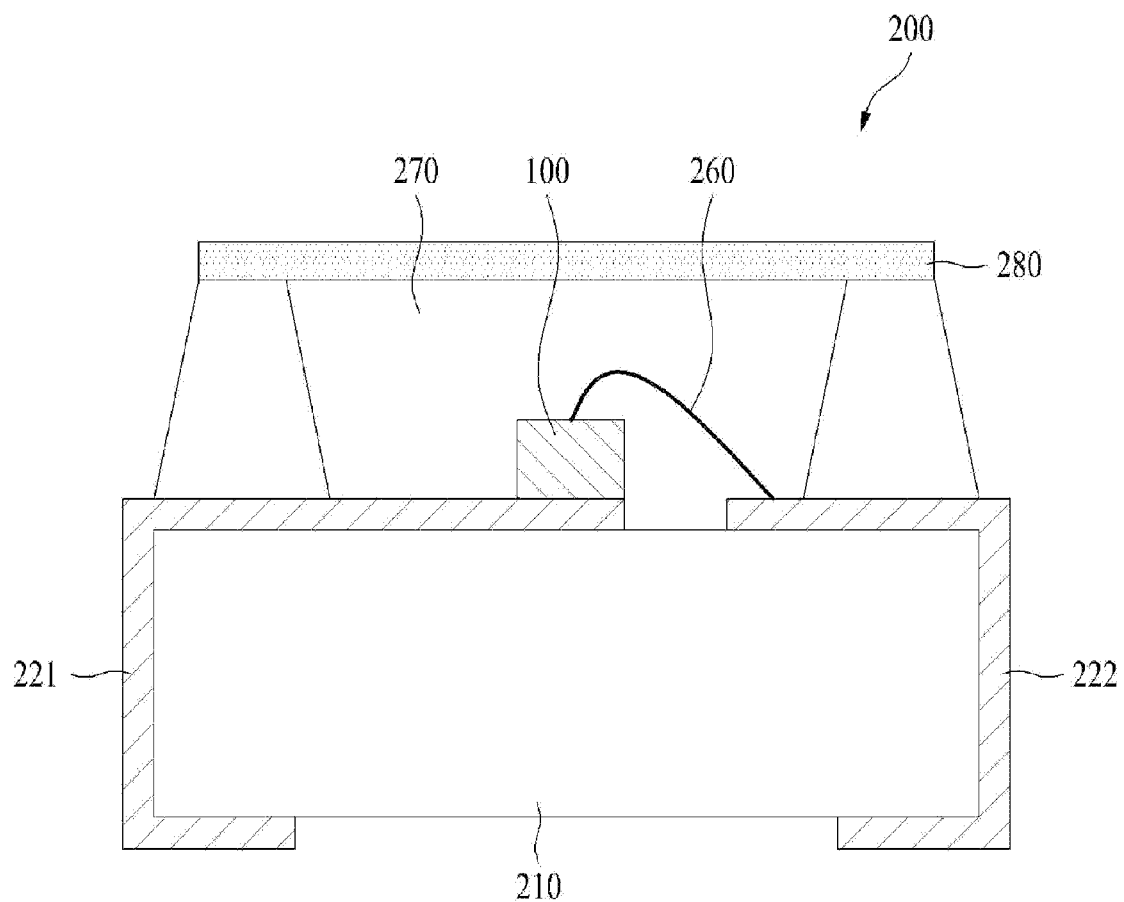
FIG. 14 is a view illustrating a light emitting device package having a light emitting device arranged thereto in accordance with one embodiment.

FIG. 14 is a view illustrating a light emitting device package having a light emitting device disposed thereto in accordance with one embodiment.

Referring to FIG. 14, the light emitting device package 200 includes a body 210 having a cavity, a first lead frame 221 and a second lead frame 222 mounted to the body 210, a light emitting device 100 of the embodiment mounted to the body 210 connected to the first lead frame 221 and the second lead frame 222 electrically, and a molded portion 270 formed in the cavity.

The body 210 may be formed of PPA resin, silicon, synthetic resin, or metal. Though not shown, if the body 210 is formed of a conductive material, such as metal, electric short circuit between the body 210 and the first and second lead frames 221 and 222 may be prevented by coating an insulating layer on a surface of the body 210.

The first lead frame 221 and the second lead frame 222 are isolated from each other electrically, and provide a current to the light emitting device 100. And, the first lead frame 221 and the second lead frame 222 may increase optical efficiency by reflecting the light from the light emitting device 100, and may also dissipate heat from the light emitting device 100 to an outside of the light emitting device package.

The light emitting device 100 may be mounted on the body 210, the first lead frame 221, or the second lead frame 222. The embodiment suggests the first lead frame 221 and the light emitting device 100 in communication with each other electrically, and the second lead frame 222 and the light emitting device 100 connected with a wire to each other. Besides the wire bonding type, the light emitting device 100 may be connected to the first and the second lead frames 221, and 222 by flip chip type, or die bonding type, electrically.

The molded portion 270 may enclose the light emitting device 100 to protect the same. And, though the molded portion 270 may have a fluorescent material included thereto, the embodiment may suggest arranging a fluorescent body 280 provided separate from the molded portion 270, or a conformal coating of the fluorescent material on the light emitting device 100.

A light of a first wavelength band from the light emitting device 100 may be excited into a light of a second wavelength band by the fluorescent body 280, and the light of the second wavelength band may be involved in a light path change as the light of the second wavelength band passes a lens (Not shown).

An array of the light emitting device packages of the embodiment may be on a substrate, and a light guide plate, a prism sheet, a diffusion sheet, and the like that are optical members may be disposed on a light path of the light emitting device package. The light emitting device package, the substrate, and the optical members may function as a lighting unit. As another embodiment, a display device, an indicating device, or a lighting system may be produced, which includes the semiconductor light emitting device or the light emitting device package described in the foregoing embodiments, and the lighting system may include, for an example, a lamp or a street light.

As one embodiment of a lighting system having the foregoing light emitting device package mounted thereto, a lighting device and a backlight unit will be described.

Figure 15:
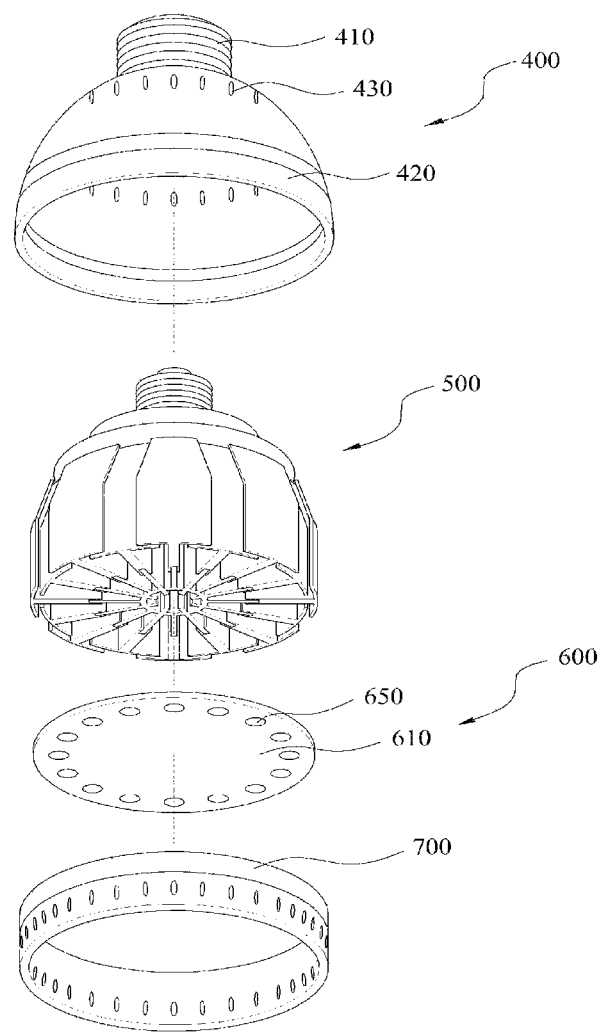
FIG. 15 is a view illustrating a lighting device including a light emitting device package in accordance with one embodiment.

FIG. 15 is a view illustrating an exploded perspective view of a lighting device in accordance with one embodiment.

Referring to FIG. 15, the lighting device includes a light source 600 for projecting a light, a housing 400 for housing the light source 600, a heat dissipating unit 500 for dissipating heat from the light source 600, and a holder 700 for fastening the light source 600 and the heat dissipating unit 500 to the housing 400.

The housing 400 includes a socket fastening portion 410 for fastening the housing 400 to an electric socket (Not shown) and a body portion 420 connected to the socket fastening portion 410 for housing the light source 600. The body portion 420 may have an air flow opening 430 passing therethrough.

The body portion 420 of the housing 400 has a plurality of air flow openings 430. The air flow opening 430 may be singular or plural disposed radially as shown in the drawing. Besides this, the arrangement of the air flow opening 430 may vary.

And, the light source 600 has a plurality of light emitting device modules 650 provided on a circuit board 610. The circuit board 610 may have a shape that may be placed in an opening of the housing 400, and may be formed of a material having high heat conductivity for transfer of heat to the heat dissipating unit 500, to be described later.

The holder 700 is provided under the light source, including a frame and another air flow openings. And, though not shown, an optical member may be provided to a lower side of the light source 600 for making the light from the light emitting device package 600 of the light source 600 to diverge, scatter, or converge.

Figure 16:
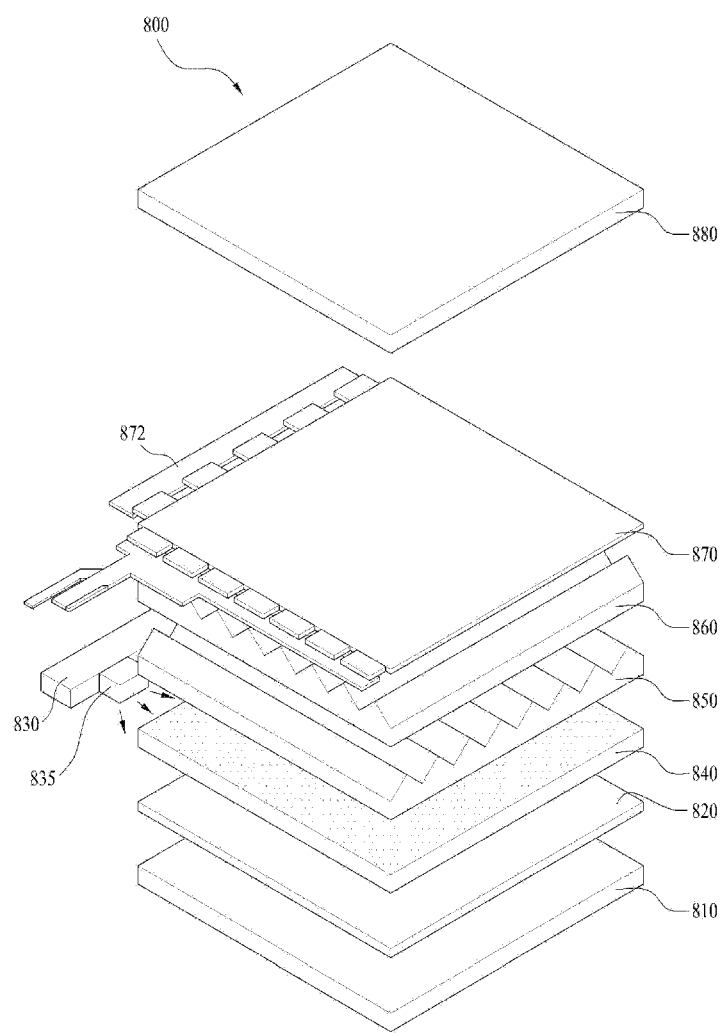
FIG. 16 is a view illustrating a display device including a light emitting device package in accordance with one embodiment.

FIG. 16 illustrates an exploded perspective view of a display device having a light emitting device package in accordance with one embodiment applied thereto.

Referring to FIG. 16, the display device 800 includes a light source module 830 and 835, a reflective plate 820 on a bottom cover 810, a light guide plate 840 disposed in front of the reflective plate 820 for guiding the light from the light source module to a front of the display device, a first prism sheet 850 and a second prism sheet 860 disposed in front of the light guide plate 840, a panel 870 disposed in front of the second prism sheet 860, a picture signal forwarding circuit 872 connected to the panel 870 for supplying a picture signal to the panel 870, and a color filter 880 disposed throughout the panel 870.

The light source module includes a light emitting device package 835 on a circuit board 830. In this instance, the circuit board 830 may be constructed of PCB, and the light emitting device package 835 is the same with the description made with reference to FIG. 14.

The bottom cover 810 may accommodate elements of the display device 800. And, the reflective plate 820 may be an individual element as shown in the drawing, or may be a coat of a material with a high reflectivity on a rear of the light guide plate 840 or on a front of the bottom cover 810.

In this instance, the reflective plate 820 can be formed of a material which has high reflectivity and can form a micronfilm, such as PET (PolyEthylene Terephtalate).

The light guide plate 840 scatters the light from the light emitting device package module for uniform distribution of the light to an entire region of a screen of the liquid crystal display device. Accordingly, the light guide plate 840 is formed of a material having good refractivity and transmissivity, such as PolyMethylMethAcrylate PMMA, PolyCarbonate PC, or PolyEthylene PE. And, it is viable that the light guide plate may be omitted to have an air guide type in which the light is transmitted through a space over the reflective plate 820.

And, the first prism sheet 850 may be formed of a polymer having light transmissivity and elasticity on one side of a supporting film. The polymer may have a prism layer with a plurality of three dimensional structures disposed thereon, repeatedly. In this instance, as shown, the plurality of patterns can be a stripe type with repetitive ridges and grooves.

And, a direction of the ridges and the grooves in the second prism sheet 860 may be perpendicular to a direction of the ridges and the grooves in the first prism sheet 850, for uniform distribution of the light from the light source module and the reflective sheet to an entire surface of the panel 870.

In the embodiment, the first prism sheet 850 and the second prism sheet 860 construe the optical sheet. The optical sheet may be constructed of other combination, for an example, a microlens array, a combination of the diffusion sheet and the microlens array, a combination of one prism sheet and the microlens array, or so on.

As the panel 870, a liquid crystal panel may be applied, and other kinds of display devices each of which requires a light source may be applied.

The panel 870 has liquid crystals disposed between glass panels, and a polarizing plate placed on both of the glass panels for utilizing polarizability of a light. The liquid crystals have intermediate characteristics of liquid and solid, in which the liquid crystals, organic molecules with fluidity like the liquid, are arranged regularly like crystal. By utilizing a characteristic of the liquid crystals in which a molecular arrangement varies with an external electric field, a picture is displayed.

The liquid crystal panel used in the display device has an active matrix system, in which a transistor is used as a switch for controlling a voltage supplied to pixels.

The panel 870 has a color filter 880 on a front for each of pixels to transmit only red, green and blue lights of the light from the panel 870, thereby displaying a picture.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
   a light emitting structure having a first conduction type semiconductor layer, an active layer, and a second conduction type semiconductor layer;
   an ohmic layer disposed below the light emitting structure;
   a transparent conductive layer disposed on the light emitting structure;
   a passivation layer disposed at a side surface of the light emitting structure extended to sides and a top side of the transparent conductive layer; and
   a metal filter having an irregular pattern disposed in the transparent conductive layer, the metal filter having metal stripes and openings between the metal stripes,
   wherein an upper portion of a side surface of the second conduction type semiconductor layer directly contacts the passivation layer, wherein a lower portion of the side surface of the second conduction type semiconductor layer is opened, wherein an outer width of the opened lower portion of the second conduction type semiconductor layer is smaller than a width of the passivation layer, and wherein a lower surface of the passivation layer is separated from an upper surface of the ohmic layer.

2. The light emitting device as claimed in claim 1, wherein the metal filter includes aluminum or titanium.

3. The light emitting device as claimed in claim 1, wherein the metal filter reflects a light from the light emitting structure.

4. The light emitting device as claimed in claim 1, wherein the light emitting structure has a roughness disposed on a surface thereof.

5. The light emitting device as claimed in claim 1, wherein the metal filter has a stripe type pattern.

6. The light emitting device as claimed in claim 1, wherein the metal filter has a mesh type pattern.

7. The light emitting device as claimed in claim 1, wherein the metal stripes have irregular widths and the openings have regular widths.

8. The light emitting device as claimed in claim 1, wherein the openings have irregular widths and the metal stripes have regular widths.

9. The light emitting device as claimed in claim 1, wherein at least one of the metal stripes has a first side width and a second side width, and the first side width is different from the second side width.

10. The light emitting device as claimed in claim 1, wherein a width of one of the metal stripes is 10% to 20% of the opening width.

11. The light emitting device as claimed in claim 1, wherein the metal filter has a thickness of 1 μm to 10 μM.

12. The light emitting device as claimed in claim 1, wherein the passivation layer is formed of a non-conductive oxide or a non-conductive nitride.

13. A lighting system comprising:
a light emitting device package including:
a light emitting structure having a first lead frame, a second lead frame, a first conduction type semiconductor layer, an active layer, and a second conduction type semiconductor layer;
an ohmic layer disposed below the light emitting structure;
a transparent conductive layer disposed on the light emitting structure;
a passivation layer disposed at a side surface of the light emitting structure extended to sides and a top side of the transparent conductive layer; and
a metal filter having an irregular pattern disposed in the transparent conductive layer, the metal filter having metal stripes and openings between the metal stripes,
wherein an upper portion of a side surface of the second conduction type semiconductor layer directly contacts the passivation layer,
wherein a lower portion of the side surface of the second conduction type semiconductor layer is opened,
wherein an outer width of the opened lower portion of the second conduction type semiconductor layer is smaller than a width of the passivation layer, and
wherein a lower surface of the passivation layer is separated from an upper surface of the ohmic layer,
a circuit board having the light emitting device package arranged thereto; and
an optical member for forwarding a light from the light emitting device package.

14. The lighting system as claimed in claim 13, wherein the metal filter reflects a light from the light emitting structure.

15. The lighting system as claimed in claim 13, wherein at least one of the metal stripes has a first side width and a second side width, and the first side width is different from the second side width.

16. The lighting system as claimed in claim 13, wherein the passivation layer is formed of a non-conductive oxide or a non-conductive nitride.

17. The light emitting device as claimed in claim 1, further comprising a metal support disposed below the ohmic layer, wherein the outer width of the opened lower portion of the second conduction type semiconductor layer is less than a width of the metal support.

18. The light emitting device as claimed in claim 1, wherein a top side of one portion of the transparent conductive layer is covered by the passivation layer, and a top side of another portion of the transparent conductive layer is opened.

19. The lighting system as claimed in claim 13, wherein the light emitting device package further comprises a metal support disposed below the ohmic layer, and
wherein the outer width of the opened lower portion of the second conduction type semiconductor layer is less than a width of the metal support.

20. The lighting system as claimed in claim 13, wherein a top side of one portion of the transparent conductive layer is covered by the passivation layer, and a top side of another portion of the transparent conductive layer is opened.

* * * * *